United States Patent
Lemke et al.

[11] Patent Number: 6,024,584
[45] Date of Patent: *Feb. 15, 2000

[54] HIGH DENSITY CONNECTOR

[75] Inventors: Timothy A. Lemke, Dillsburg; Timothy W. Houtz, Etters, both of Pa.

[73] Assignee: Berg Technology, Inc., Reno, Nev.

[*] Notice: This patent issued on a continued prosecution application filed under 37 CFR 1.53(d), and is subject to the twenty year patent term provisions of 35 U.S.C. 154(a)(2).

[21] Appl. No.: 08/728,194

[22] Filed: Oct. 10, 1996

[51] Int. Cl.$^7$ .................................................. H01R 9/09

[52] U.S. Cl. ................................................. 439/83

[58] Field of Search .................. 439/78, 83, 76.1, 439/682, 686, 689, 108; 29/839, 840, 842, 843

[56] References Cited

U.S. PATENT DOCUMENTS

| | | | |
|---|---|---|---|
| 3,320,658 | 5/1967 | Bolda et al. | 29/155.5 |
| 3,719,981 | 3/1973 | Steltz | 29/423 |
| 3,864,004 | 2/1975 | Friend . | |
| 3,889,364 | 6/1975 | Krueger . | |
| 4,056,302 | 11/1977 | Braun et al. | 339/275 B |
| 4,097,266 | 6/1978 | Takahaski et al. | 75/0.5 R |
| 4,274,700 | 6/1981 | Keglewitsch et al. | 439/682 |
| 4,380,518 | 4/1983 | Wydro | 264/13 |
| 4,396,140 | 8/1983 | Jaffe et al. | 228/123 |
| 4,462,534 | 7/1984 | Bitaillou et al. | 228/180 |
| 4,641,426 | 2/1987 | Hartman et al. | 29/839 |
| 4,664,309 | 5/1987 | Allen et al. | 228/180 |

(List continued on next page.)

FOREIGN PATENT DOCUMENTS

| | | |
|---|---|---|
| 0 591 772 A1 | 4/1994 | European Pat. Off. . |
| 6-0072663 | 4/1985 | Japan . |
| 0278893 | 11/1990 | Japan . |
| 96/42123 | 7/1996 | WIPO . |
| 97/20454 | 7/1997 | WIPO . |

OTHER PUBLICATIONS

Philip C. Kazmierowicz, "The Science Behind Conveyor Oven Thermal Profiling" KIC Oven Profiling, Reprinted from Feb. 1990 issue of *Surface Technology*.
Research Disclosure, Aug. 1990, No. 316, Kenneth Mason Publications Ltd., England.
Research Disclosure, Oct. 1992, No. 342, Kenneth Mason Publications Ltd., England.
IBM Technical Disclosure Bulletin, vol. 20, No. 2 (Jul. 1977).
IBM Technical Disclosure Bulletin, vol. 32, No. 11 (Apr. 1990).
IBM Technical Disclosure Bulletin, vol. 14, No. 8 (Jan. 1972).
Berg Electronics Catalog, p. 13–96, Solder Washers.
Philip C. Kazmierowicz, "Profiling Your Solder Reflow Oven in Three Passes or Less," Reprinted From Feb. 1990 issue of *Surface Mount Technology*.
Alphametals, "Micro Electronic Interconnects" date unknown.

*Primary Examiner*—Gary Pauman
*Attorney, Agent, or Firm*—Brian J. Hamilla; M. Richard Page; Daniel J. Long

[57] ABSTRACT

Disclosed is an electrical connector in which the contacts are fused to a solder ball conductive material which are reflowed to provide a primary electrical current path between the connection and a substrate. Also disclosed is a method for fusing the conductive element to the contacts of the connector. There is at least one recess on the exterior side of the connector elements. A conductive contact extends from adjacent the interior side of the conductor element into the recess on the exterior side of the housing. A conductive element which will ordinarily be a solder ball is positioned in the recess on the exterior side of the housing. The metallic element emplaced in the recess is then heated to a temperature sufficient to soften the metallic element and fuse the metallic element to the contact extending into said recess.

48 Claims, 23 Drawing Sheets

U.S. PATENT DOCUMENTS

| | | | |
|---|---|---|---|
| 4,678,250 | 7/1987 | Romine et al. | 439/83 |
| 4,705,205 | 11/1987 | Allen et al. | 228/180 |
| 4,722,470 | 2/1988 | Johary | 228/180 |
| 4,767,344 | 8/1988 | Noschese | 439/83 |
| 4,830,264 | 5/1989 | Bitalilloou | 228/180.2 |
| 4,871,110 | 10/1989 | Fukasawa et al. | 228/245 |
| 4,884,335 | 12/1989 | McCoy et al. | 439/83 |
| 5,024,372 | 6/1991 | Altman et al. | 228/248 |
| 5,060,844 | 10/1991 | Behun et al. | 228/180 |
| 5,093,986 | 3/1992 | Mandal et al. | 29/843 |
| 5,111,991 | 5/1992 | Clawson et al. | 228/180 |
| 5,118,027 | 6/1992 | Braun et al. | 228/180 |
| 5,145,104 | 9/1992 | Apap et al. | 228/179 |
| 5,203,075 | 4/1993 | Angulas et al. | 29/830 |
| 5,207,372 | 5/1993 | Funari et al. | 228/180 |
| 5,222,649 | 6/1993 | Funari et al. | 228/6.2 |
| 5,229,016 | 7/1993 | Hayes et al. | 222/590 |
| 5,255,839 | 10/1993 | Alves et al. | 228/180 |
| 5,261,155 | 11/1993 | Angulas et al. | 29/830 |
| 5,269,453 | 12/1993 | Melton et al. | 228/180 |
| 5,275,330 | 1/1994 | Isaacs et al. | 228/180 |
| 5,284,287 | 2/1994 | Wilson et al. | 228/180.2 |
| 5,324,569 | 6/1994 | Nagesh et al. | 428/198 |
| 5,342,211 | 8/1994 | Broeksteeg | 439/108 |
| 5,346,118 | 9/1994 | Degani et al. | 228/180.22 |
| 5,355,283 | 10/1994 | Marrs et al. | 361/760 |
| 5,358,417 | 10/1994 | Schmedding . | |
| 5,377,902 | 1/1995 | Hayes | 228/254 |
| 5,387,139 | 2/1995 | McKee et al. | 439/876 |
| 5,409,157 | 4/1995 | Nagesh et al. | 228/180.22 |
| 5,410,807 | 5/1995 | Brose et al. | 29/843 |
| 5,431,332 | 7/1995 | Kirby et al. | 228/246 |
| 5,435,482 | 7/1995 | Variot et al. | 228/254 |
| 5,442,852 | 8/1995 | Danner | 29/843 |
| 5,445,313 | 8/1995 | Boyd et al. | 228/248.1 |
| 5,467,913 | 11/1995 | Namekawa et al. | 228/41 |
| 5,477,933 | 12/1995 | Nguyen | 174/262 |
| 5,489,750 | 2/1996 | Sakemi et al. | 174/261 |
| 5,491,303 | 2/1996 | Weiss | 174/262 |
| 5,492,266 | 2/1996 | Hoebener et al. | 228/248.1 |
| 5,499,487 | 3/1996 | McGill | 53/473 |
| 5,504,277 | 4/1996 | Danner | 174/261 |
| 5,516,030 | 5/1996 | Denton | 228/180.22 |
| 5,516,032 | 5/1996 | Sakemi et al. | 228/246 |
| 5,518,410 | 5/1996 | Masami | 439/71 |
| 5,519,580 | 5/1996 | Natarajan et al. | 361/760 |
| 5,534,127 | 7/1996 | Sakai | 205/125 |
| 5,539,153 | 7/1996 | Schwiebert et al. | 174/260 |
| 5,542,174 | 8/1996 | Chiu | 29/840 |
| 5,591,941 | 1/1997 | Acocella et al. . | |
| 5,593,322 | 1/1997 | Swamy et al. | 439/83 |
| 5,613,882 | 3/1997 | Hnatvck et al. | 439/686 |
| 5,702,255 | 12/1997 | Murphy et al. . | |
| 5,730,606 | 3/1998 | Sinclair . | |
| 5,772,451 | 7/1998 | Dozier, II et al. . | |

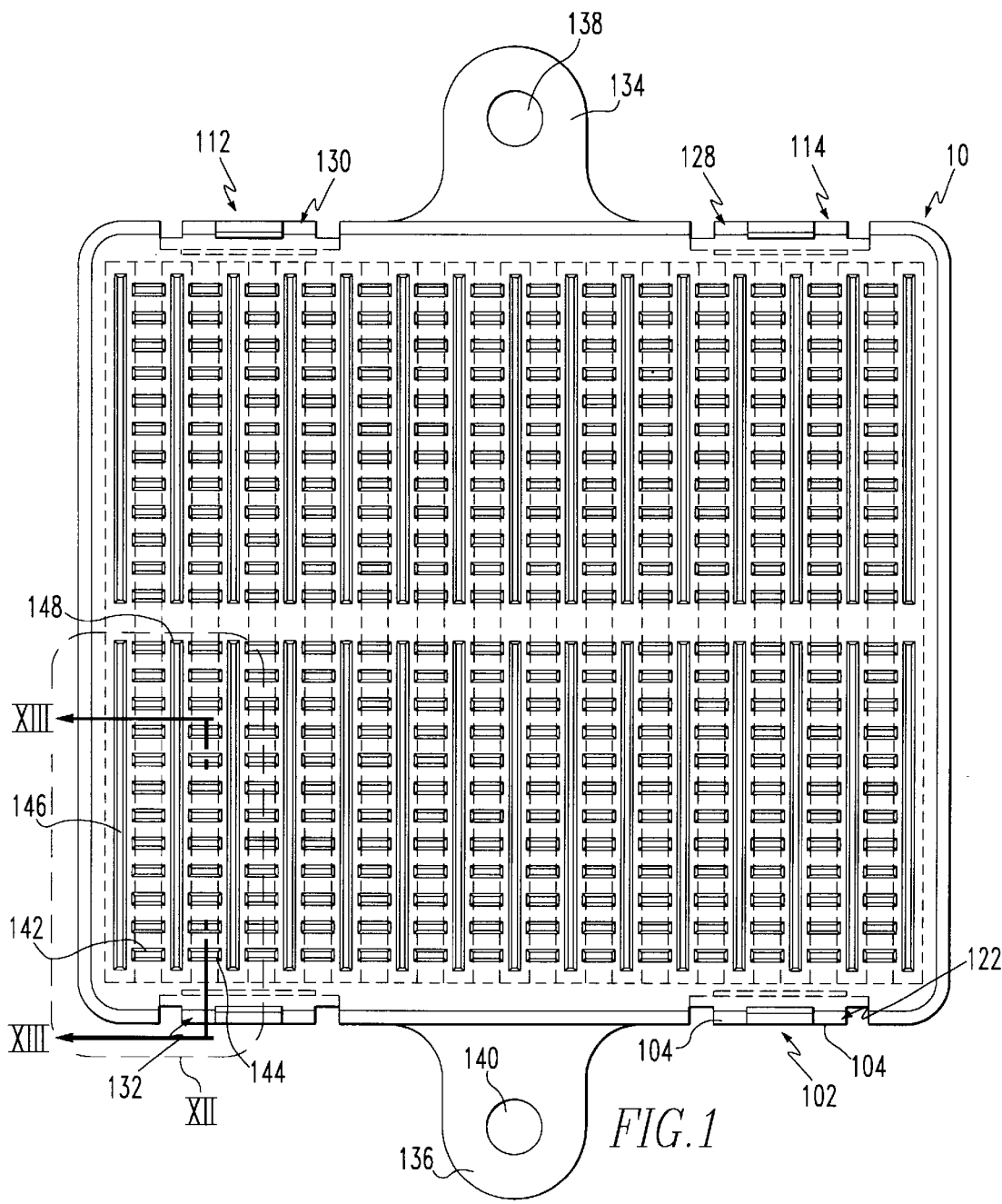
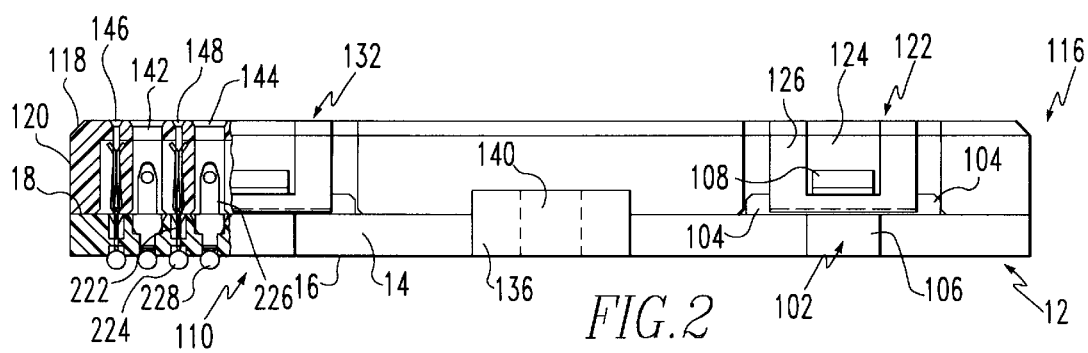

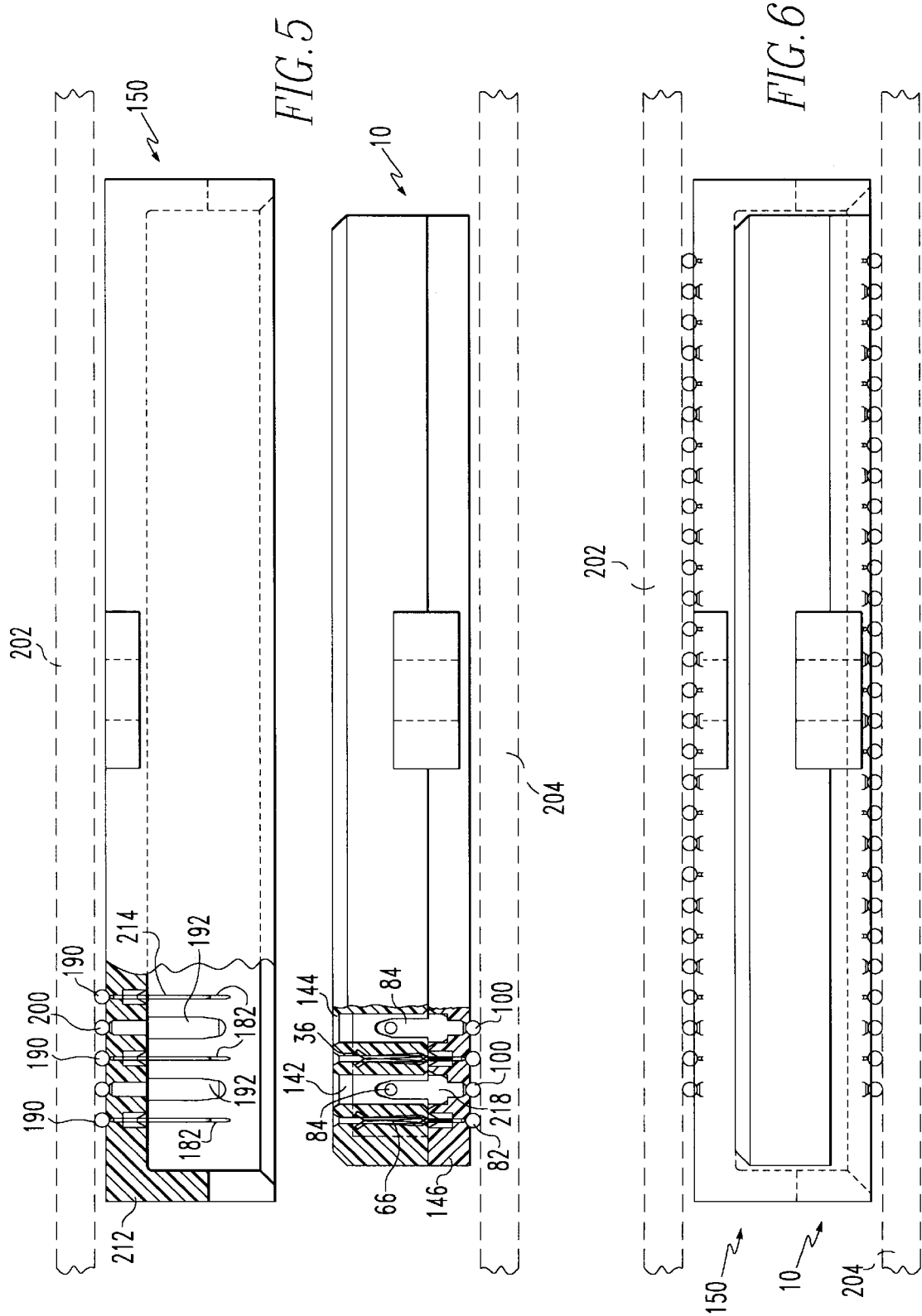

HIGH DENSITY CONNECTOR

Cross Reference to Related Applications

This application is related to U.S. Pat. application Ser. No. 08/452,020, filed Jun. 12, 1995 entitled "Low Cross Talk and Impedance Controlled Electrical Connector" and to U.S. Pat. application Ser. No. 60/027,611, filed Oct. 10, 1996 entitled "Low Profile Array Connector".

BACKGROUND OF THE INVENTION

1. Field of the Invention

The present invention relates to electrical connectors and more particularly high I/O density array connectors.

2. Brief Description of Prior Developments

The drive to reduce the size of electronic equipment, particularly personal portable devices, and to add additional functions to such equipment, has resulted in an ongoing drive for miniaturization of all components, especially electrical connectors. Efforts to miniaturize connectors have included reducing the pitch between terminals in single or double row in-line connectors, so that a relatively high number of I/O or other lines can be interconnected by connectors that fit within tightly circumscribed areas on the circuit substrates being electrically connected. The drive for miniaturization has also been accompanied by a shift in preference to surface mount techniques (SMT) for circuit board manufacture. The confluence of the increasing use of SMT and the required fine pitch of in-line connectors has resulted in approaching the limits SMT for high volume, low cost operations. Reducing the pitch of the terminals increases the risk of bridging adjacent solder pad or terminals during reflow of the solder paste. To satisfy the need for increased I/O density, array connectors have been proposed. Such connectors have a two dimensional array of terminals mounted on an insulative substrate and can provide improved density. However, these connectors present certain difficulties with respect to attachment to the circuit substrates by SMT techniques because the surface mount tails and most of the terminals must be beneath the connector body. As a result, the techniques used must be highly reliable because it is not possible to visually inspect the solder connections or repair them if faulty. In the mounting of an integrated circuit (IC) on a plastic or ceramic substrate the use of ball grid array (BGA) and other similar packages has become common. In a BGA package, spherical solder balls are positioned on electrical contact pads of a circuit substrate by means of a paste typically applied with a stencil or supporting device. The unit is then heated. The IC may thereby be connected to the substrate without need of external leads on the IC.

While the use of BGA and similar systems in connecting an IC to a substrate has many advantages, a corresponding means for mounting an electrical connector on a printed wiring board (PWB) or other substrate has yet to be developed. It is, for example, important that the completed solder balls be of a similar size so that in the final application the balls will reflow and solder evenly to a printed circuit board substrate. Any significant differences in solder ball size on a given substrate could cause problems when the final assembly is applied to a printed circuit board. The final size of the ball is dependent on the total volume of solder initially available including the solder paste and the solder balls. In applying balls to a connector contact, this limitation could be a particular problem since variations in the volume of the connector contact adds to the potential variability.

Another problem presented in soldering connectors to a substrate is that connectors often have insulative housings which have relatively complex shapes such as having numerous cavities. Such housings may, therefore, tend to become warped or twisted either initially or after heating to reflow the solder balls. Such warping or twisting of the housing can cause a dimensional mismatch between the final connector assembly and the printed circuit board, resulting in unreliable soldering because the balls are not sufficiently in contact with the solder paste on the PWB prior to soldering.

A need, therefore, exists for a means of using of BGA or a similar package to fix an electrical connector on a substrate.

SUMMARY OF THE INVENTION

The electrical connector of the present invention is one in which one or more contacts are fused to an electrically conductive so as to be electrically connected by means of that material to a substrate. Preferably this electrically conductive material is a solder ball which has been reflowed to provide the primary electrical current path between the connector and a substrate.

The present invention includes a method for placing an exterior conductive contact on an element of an electrical connector. There is at least one recess on the exterior side of the connector elements. A conductive contact extends from adjacent the interior side of the conductor element into the recess on the exterior side of the housing. A conductive element which will ordinarily be a solder ball is positioned in the recess on the exterior side of the housing. The conductive element emplaced in the recess is then heated to a temperature sufficient to soften the conductive element and fuse the conductive element to the contact extending into said recess.

Also encompassed by this invention is a contact for use in an electrical connector which comprises a terminal tab area where said contact is connectable to a solder ball. This terminal tab is plated with a solderable metal. A contact area is positioned in opposed relation to said terminal tab and plated with a precious metal. A medial area is positioned between said terminal tab and said contact area and said medial area is plated with a non-solderable metal. By means of this plating system wicking of the solder from the solder ball beyond the non-solderable metal is avoided.

This invention also includes an element of an electrical connector which has at least one flattened contact having opposed major sides and opposed minor ends. The contact is mounted in a slot in the housing and a generally pyramidal shaped projection extends from said housing into said slot to about one of said major sides of said contact. By means of this arrangement, stress build up is prevented so as to prevent warping and twisting of the housing.

BRIEF DESCRIPTION OF THE DRAWINGS

The method and connector of the present invention is further described with reference to the accompanying drawings in which:

FIG. 1 is a top plan view of a receptacle element of a preferred embodiment of the connector of the present invention;

FIG. 2 is a cut away end view of the receptacle shown in FIG. 1;

FIG. 5 is a cut away end view of the receptacle and plug shown in FIGS. 1–4 in unmated relation;

FIG. 6 is an end view of the receptacle and plug shown in FIG. 5 in mated relation;

DETAILED DESCRIPTION OF THE PREFERRED EMBODIMENTS

A design and method of attaching solder balls to connector contacts which will minimize the variability of solder ball sizes will be discussed. This particular design consists of a connector contact with a terminating tab. The contact is inserted into a plastic housing. The contact base is inserted into a rectangular cavity and retained by frictional coupling between a generally pyramidal shaped projection. This projection is designed to hold the contact with sufficient retention, but not to allow stresses to build up in a housing which has many cavities. This is done to prevent warp and twisting of the housing either initially or after heating to reflow the solder balls. The termination tab of the connector contact projects into a square or round cavity in the plastic housing. This cavity is designed to accept solder paste. The solder paste can be applied with a simple squeegee. The solder balls are then applied to the surface of the paste. The final assembly is then reflowed to produce the final product. Variations in ball size can be minimized since the cavity can be precisely defined by the molding process, the variation in solder paste volume can be minimized, as compared to more standard processes such as screening. Furthermore, variations in the termination tab insertion depth or cutoff length are masked since the volume of the cavity is the same whether the termination tab is larger or smaller makes little difference, since the solder paste displaces any differences. This results in solder balls of uniform size and height. This particular design the solder in the cavity locks the contact into place into the connector housing, providing some structural support, so that the contacts cannot be displaced during application and use.

Figure 12:
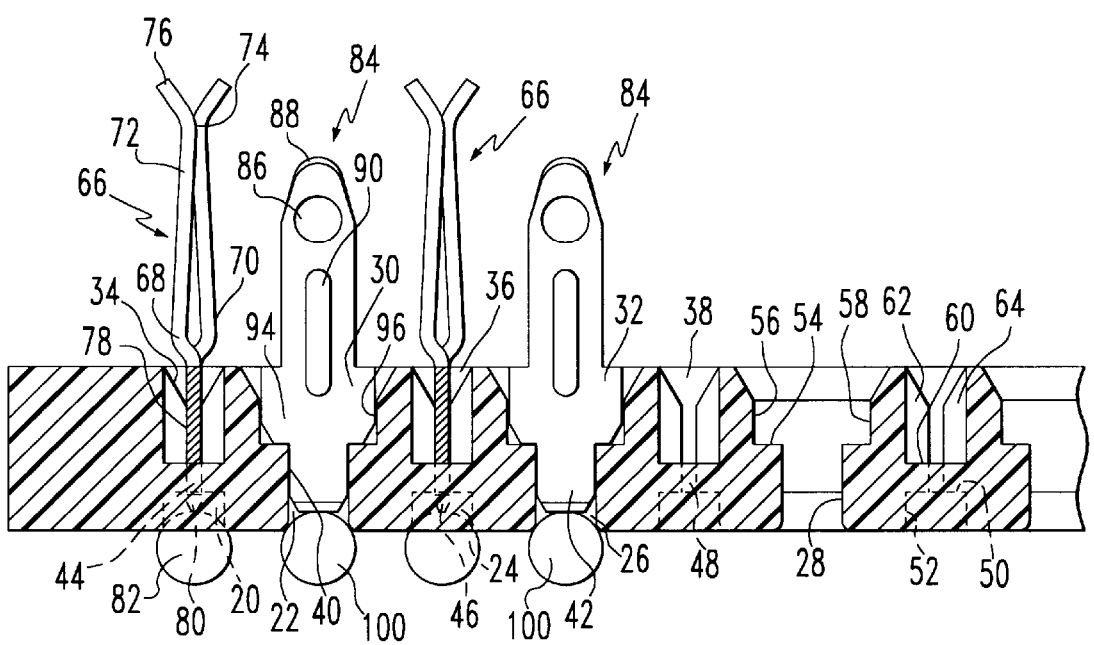
FIG. 12 is an enlarged view of the cut away area in FIG. 10.
Figure 13:
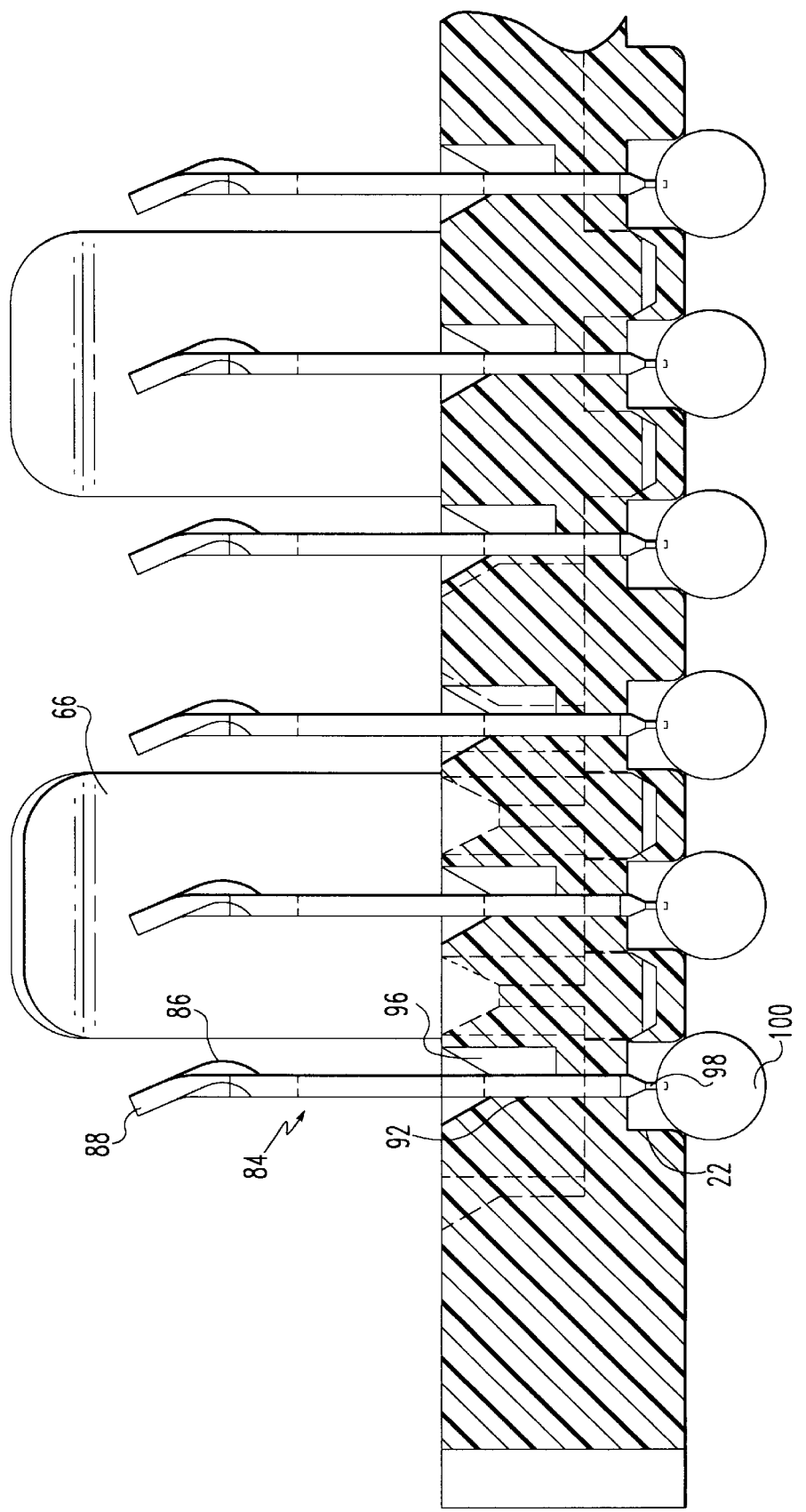
FIG. 13 is an enlarged cross sectional view through 13—13 in FIG. 10.

Referring generally to FIGS. 1–2 and 12–13, the connector according to a first embodiment of a high density connector of the present invention includes a receptacle which is shown generally at numeral 10. A base section of the receptacle is shown generally at numeral 12. Referring first to the base section, this element includes a base wall 14 which has an exterior side 16 and an interior side 18. On the exterior side there are outer recesses as, for example, recesses 20, 22, 24, 26 and 28 (FIG. 12). On the interior side there are inner signal contact receiving recesses as, for example, recesses 30, 32, 34, 36 and 38. Connecting these inner and outer recesses are medial slots as, for example, slots 40, 42, 44, 46 and 48. Each of the outer recesses has a base wall and a lateral wall as, for example, base wall 50 and lateral wall 52 (FIG. 12). Each of the inner signal contact receiving recesses has a base wall and intersecting lateral walls as, for example, base wall 54 and lateral walls 56 and 58. Each of the inner ground or power contact receiving recesses also has a base wall and diagonal lateral walls as, for example, base wall 60 and lateral walls 62 and 64. The above described inner and outer recesses and connecting medial slots holds ground or power contacts or signal contacts.

The ground or power contacts are made up of an upper section shown generally at numeral 66 which are made up of two contacting forks as at fork 68 and 70. Each of these forks has a converging section 72, a contact point and an outwardly diverging section 76. The ground or power contacts also include a medial section 78 passing through the lower wall of the receptacle and the lower section 80 where it enters the outer recess where it is fused to a solder ball 82. Such terminal tabs will be plated with a solderable metal such as gold or other precious metal or tin. Above this the contact will preferably be plated with a non-solderable metal such as nickel. Further above in the contact area, there will preferably be gold or other precious metal plating. With this plating system, undue wicking of solder from the recess area up the contact will be avoided. Alternatively, the entire contact may be plated with gold or other precious metal if a suitable florine based anti-wicking coating is used.

Each of the signal contacts (FIGS. 12 and 13) includes an upper section shown generally at numeral 84 having a forward projection 86, a rearward bend 88 and a groove 90. The signal contacts may also include a medial section 92 which passes through the lower wall of the receptacle. A generally pyramidal shaped feature as on the housing such as converging walls 94 and 96 bear against each signal contact to help stabilize the entire connector housing from warping or bending. The signal contacts also include a lower section 98 which enters the outer recess (for example, recess 22 in FIG. 15) and where it is fused to a solder ball 100 as will be explained below.

Referring to particularly to FIGS. 1–2, the base section of the receptacle includes latching structures, for example, as is shown generally at numeral 102. This latching structure includes an upward tab 104 which is superimposed over a vertical groove 106 and which has an outward projection 108. The base section of the receptacle also has other similar latching structures 110, 112 and 114. The receptacle also includes an upper section shown generally at 116 which is superimposed over the base section. This upper section has a top wall 118 and a peripheral side wall 120. This upper section is fixed to the base section by means of latching structures as is, for example, shown generally at numeral 122. Each of these latching structures has a side wall recess 124 and a U-shaped latch 126 which extends downwardly from the top wall and is spaced from the side wall recess. The tab 104 fits between the U-shaped latch 126 and the side wall recess 124 to enable the U-shaped to engage the outward projection 108 on the latching structure 102 of the base section. The upper section includes other similar latching structures 128, 130 and 132 which engage, respectively, latching structures 110, 112 and 114 on the base section. The upper section also has mounting brackets 134 and 136 which have respectively fastener apertures 138 and 140. On the upper wall 118 of the upper section 116 there are also signal contact access apertures as, for example, apertures 142 and 144. It will be observed that these apertures are arranged in a plurality of rows which correspond to rows of signal contacts in the base section. Interposed between these rows of signal contact access apertures are elongated ground or power contact access slots as, for example, slots 146 and 148.

Figure 3:
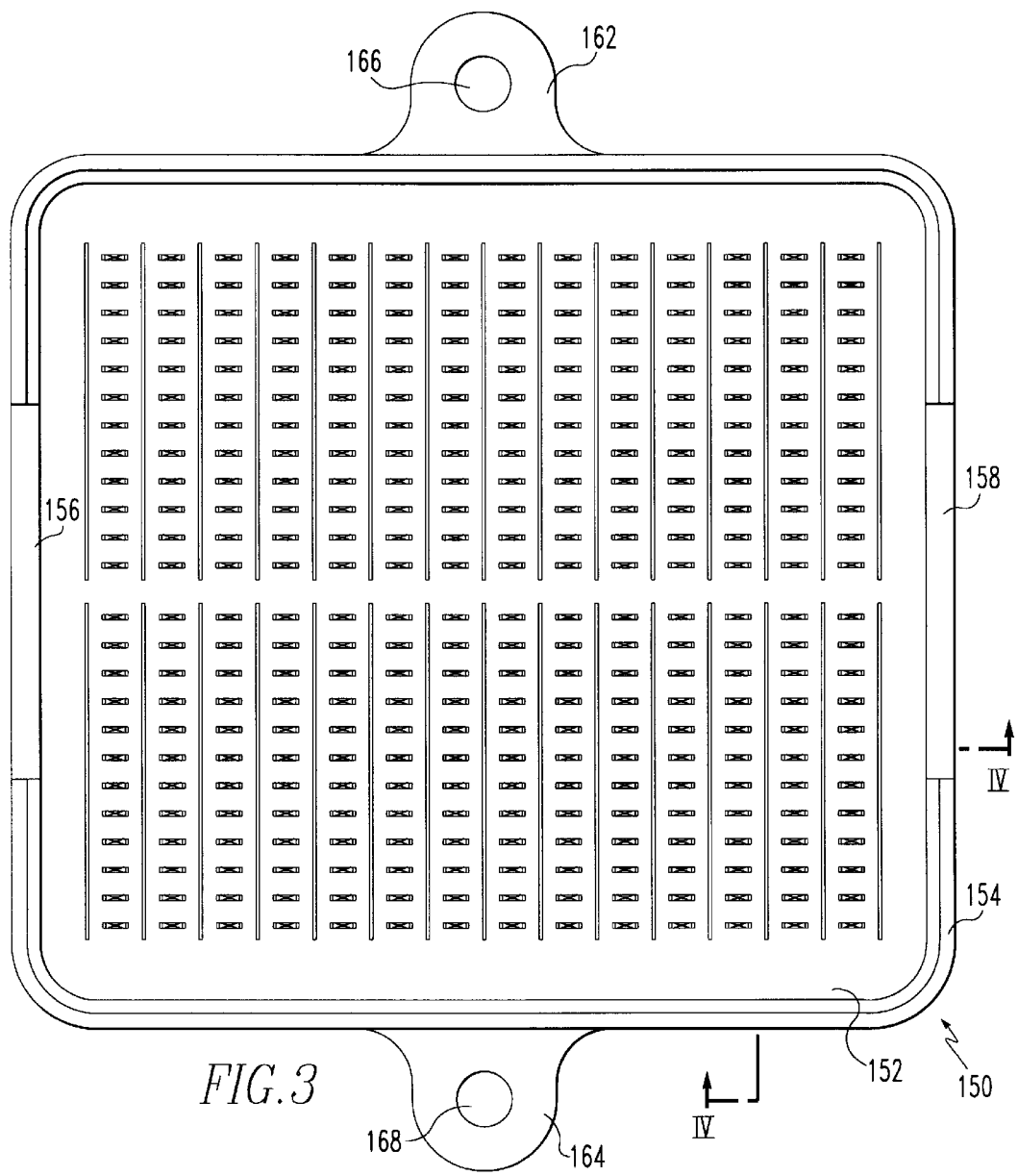
FIG. 3 is a top plan view of a plug element of a preferred embodiment of the present invention.
Figure 4:
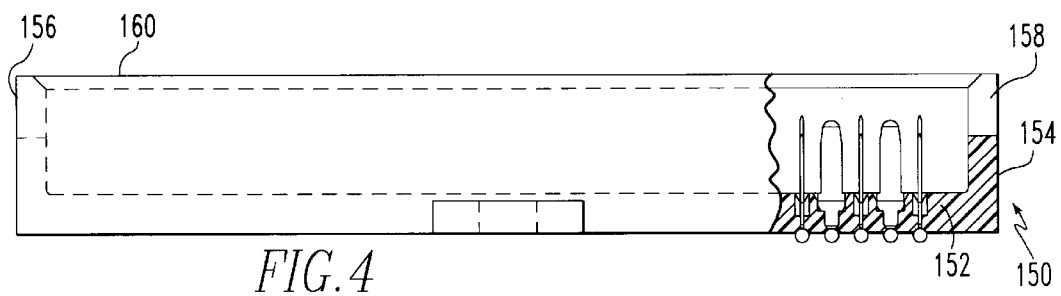
FIG. 4 is a cut away end view of the plug element shown in FIG. 3.
Figure 11:
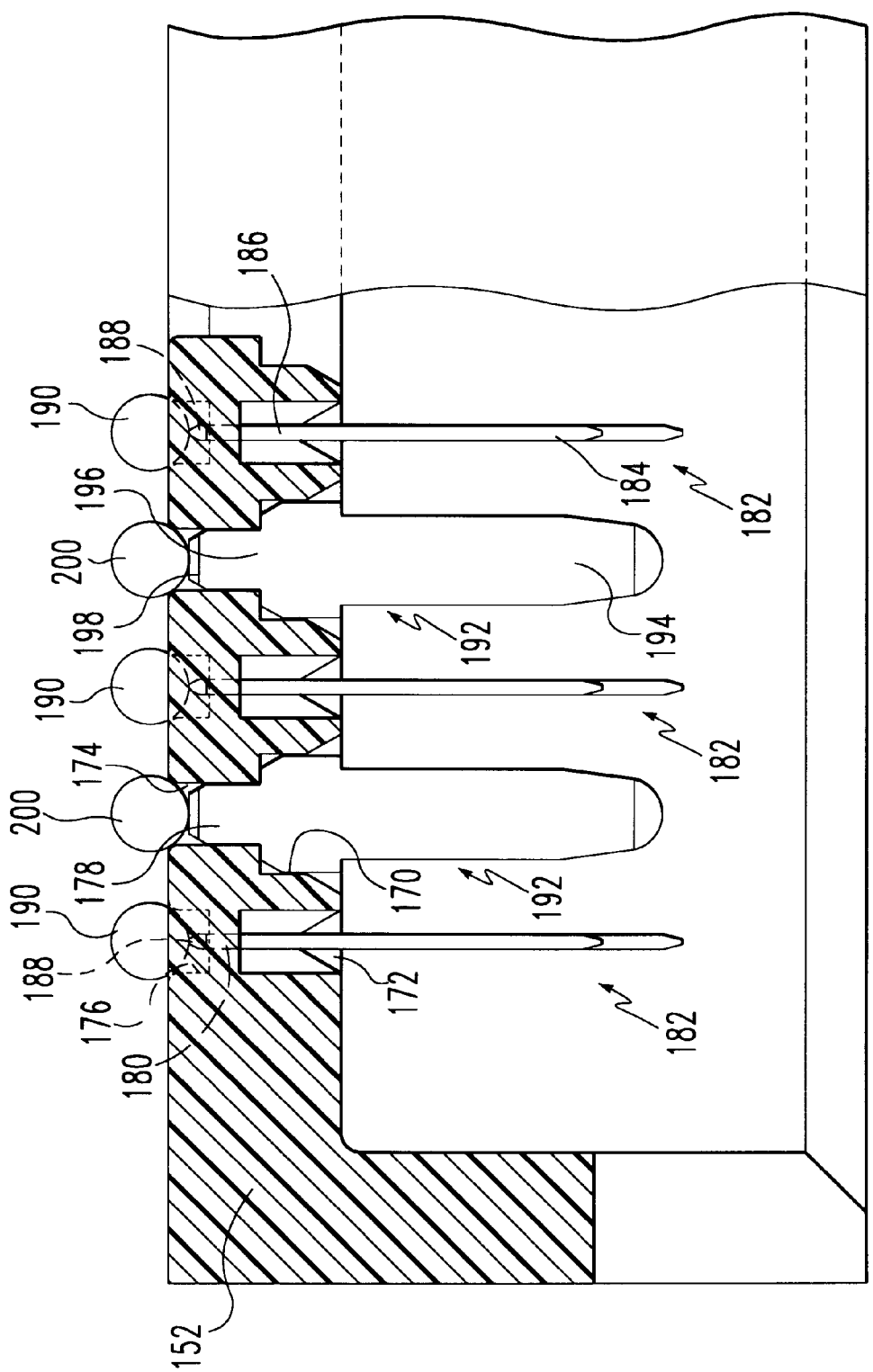
FIG. 11 is an enlarged view of the cut away area in FIG. 4.

Referring to FIGS. 3–4 and FIG. 11, the plug element of the connector is shown generally at numeral 150. The plug includes a base wall 152 and a peripheral side wall 154. There are opposed gaps 156 and 158 in the side wall and there is an open side 160 in opposed relation to the base wall. Projecting laterally from the plug there are mounting brackets 162 and 164 which have, respectively, fastener receiving apertures 166 and 168 that are alignable with the fastener receiving apertures in the mounting brackets of the receptacle. On the outer side of the base wall there are outer signal contact receiving recesses as at recess 170. Also on the outer side of the base wall are outer power or ground contact receiving recesses as at recess 172. In opposed relation to the outer recesses on the base wall there are inner signal contact receiving recesses as at recess 174 in inner power or ground contact receiving recesses as at recess 176. Connecting the outer and inner signal contact receiving recesses and the outer and inner power or ground contact receiving recesses are, respectively, medial slots 178 and 180. Mounted in the power ground contact receiving recesses and their medial slot is a power or ground contact which is shown generally at numeral 182. This contact has an elongated inner section 184, an elongated medial section 186 which is mounted in a base wall and an outer section 188 which is fused to a solder ball 190. It will be observed that this outer section and the solder ball are partially contained in the outer recess 172. The plug also includes a plurality of signal contacts as is, for example, shown generally at 192. These signal contacts have an inner section 194, a medial section 196 which are mounted in the base wall, and an terminal tab 198 which are fused to a solder ball 200. Again it will be observed that this outer section and the solder ball are partially contained in the outer recess as at 170.

Figure 7A:
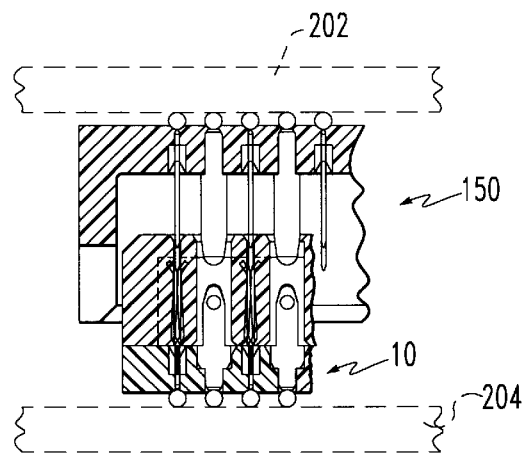
FIGS. 7a, 7b and 7c are cut away end views showing respectively first, second and third sequential stages in the mating of the receptacle end plug shown in FIG. 5.
Figure 7B:
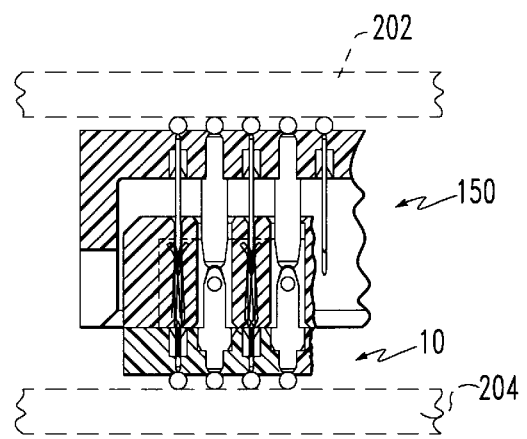
Figure 7C:
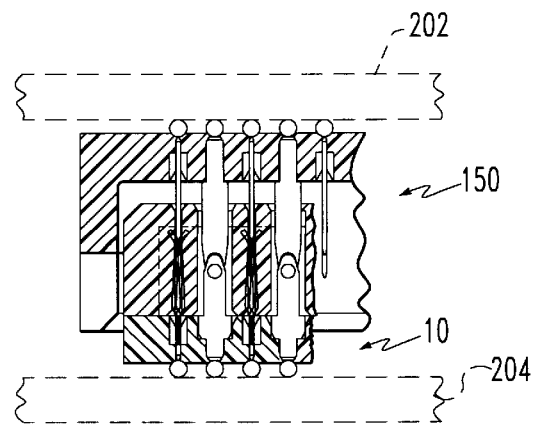

Referring to FIGS. 5–7c, it will be seen that the plug described above is mounted on a PWB 202 and the receptacle is mounted on a PWB 204. The plug and receptacle thereby forms a board to board interconnection, as illustrated in FIG. 6. In addition to the contacts previously noted, the plug has signal contacts such as 206 fused to solder 208 and the ground power contact 210 which is fused to solder ball 212 and ground or power contact 214 which is fused to solder ball 216. It will be seen that the solder balls are also fused to the PWB 202 to fix the entire plug to the PWB and effect electrical contact between the signal and ground or power contacts in the plug and the PWB. It will be appreciated that although not all contacts are illustrated in FIG. 5, all such contacts are connected to solder balls and to the PWB in the same way. Similarly it will be seen that signal contact 218 which is mounted in slot 142 is fused to solder ball 100 and that solder ball is fused to the PWB 204. Similarly signal contact 222 which is mounted in the slot 144 is fused to solder ball 224 which is itself fused to PWB 204. Ground power contact 226 is mounted in slot 148 and is fused to solder ball 228 and that solder ball is itself used to PWB 204. It will also be seen that the plug is aligned with the receptacle so that the peripheral side wall 154 of the plug overlaps the peripheral side wall 120 of the upper section 116 of the receptacle. Referring particularly to FIGS. 7a–7c the engagement of the plug and receptacle is shown in greater detail. In FIG. 7a after initial alignment the signal contacts in the plug initially engage the signal contact receiving slots in the receptacle and the power ground contacts in the plug initially engage corresponding power or ground receiving slots in the receptacle. In FIG. 7b the signal contacts in the plug initially engage the corresponding signal contacts in the receptacle and the power ground contacts in the plug become engaged between the opposed leaves of the power ground contacts in the receptacle. In FIG. 7c it is shown that the signal contacts in the plug become fully engaged with the signal contacts in the receptacle and the power ground contacts in the plug become positioned at the base of the fork of the power ground contacts in the receptacle.

Figure 8:
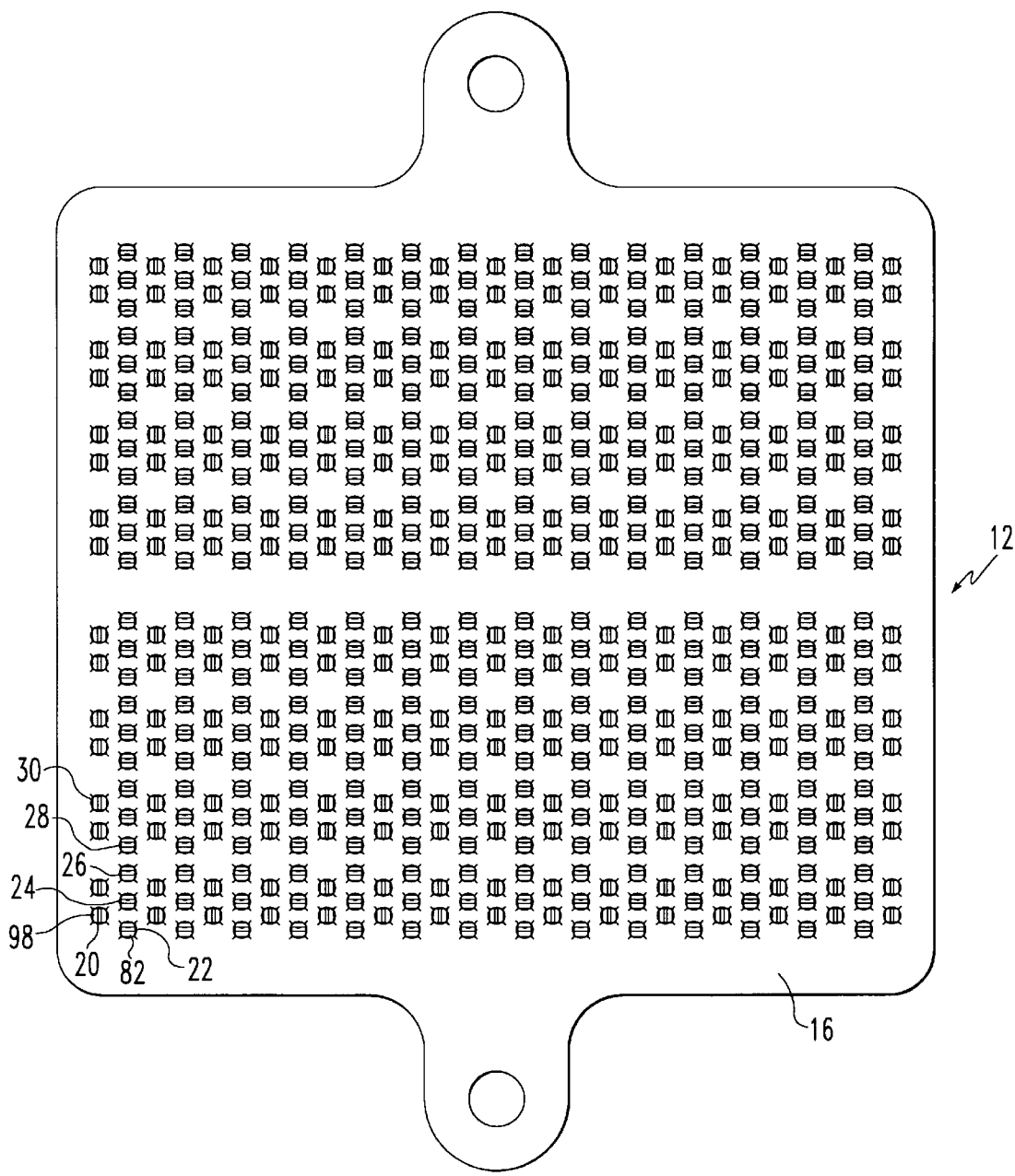
FIG. 8 is a bottom plan view of the receptacle shown in FIG. 1.
Figure 9:
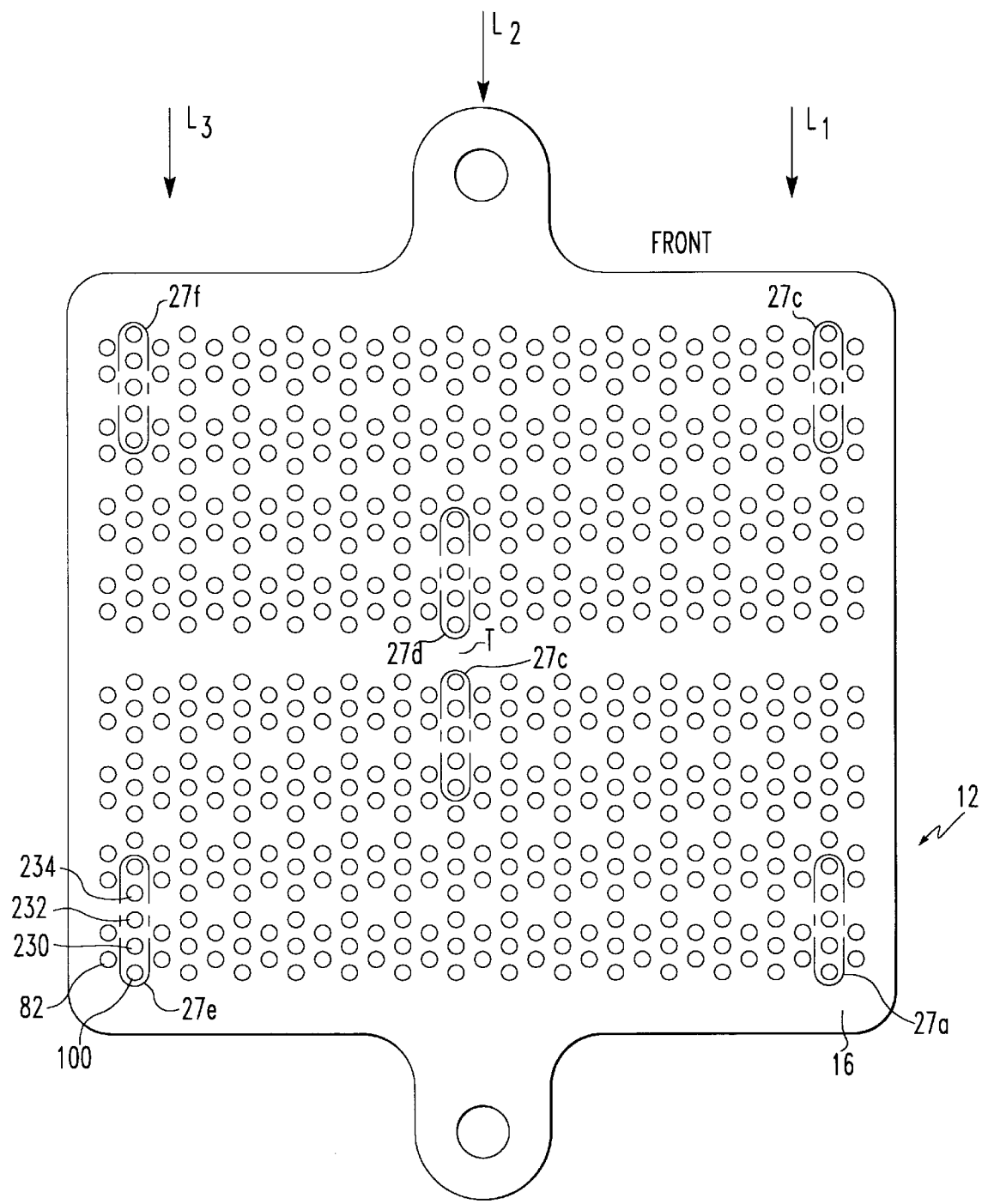
FIG. 9 is a plan view of the PWB pattern which mates with the receptacle shown in FIG. 8.
Figure 10:
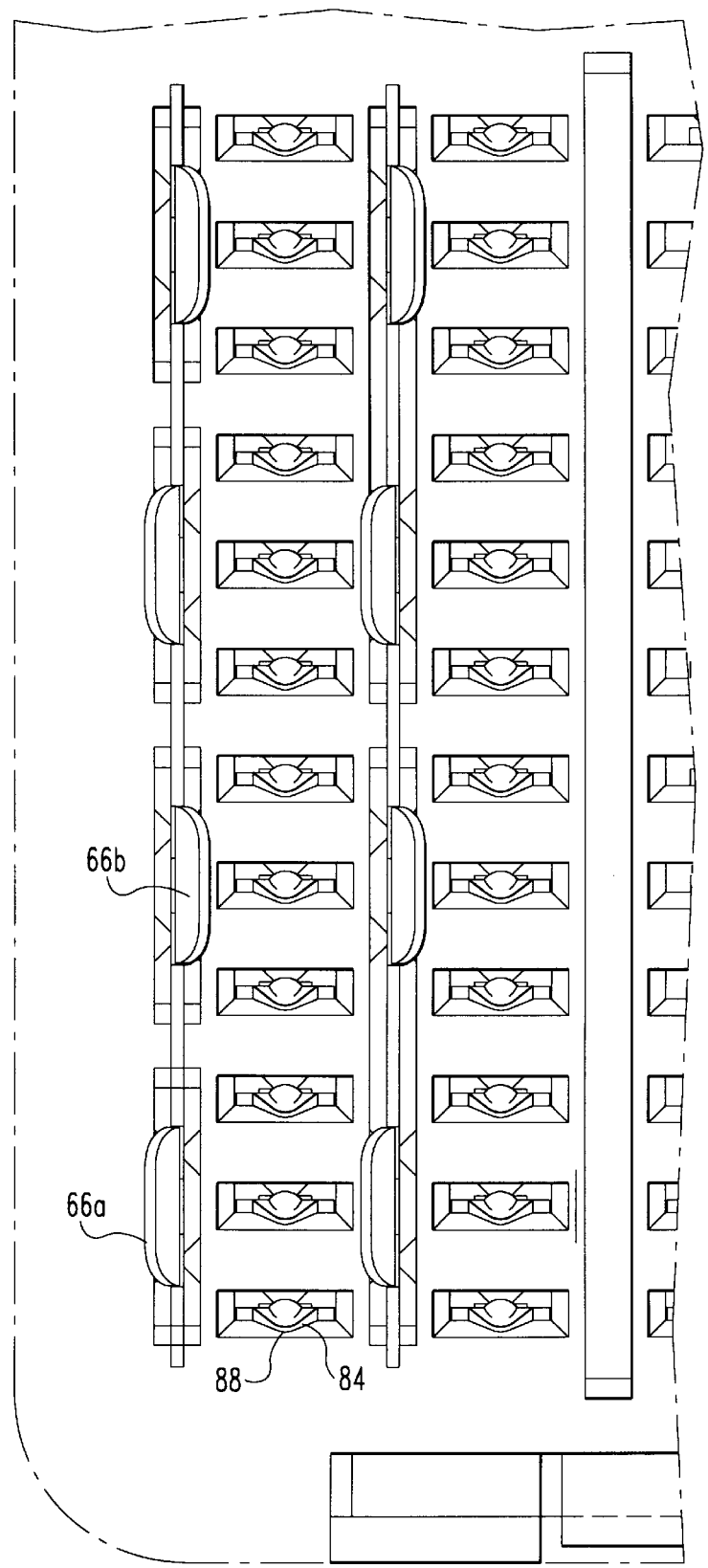
FIG. 10 is a detailed cut away view of area 10 in FIG. 1.

Referring to FIG. 8, the exterior side 16 of the base section 12 of the receptacle is shown prior to the application of the solder balls. At this stage the exterior recesses, for example, outer recesses 20, 22, 24, 26 and 28 are shown. Prior to the application of the solder balls the terminal tabs of the signal contacts, for example, terminal tab 82 and, for example, of the power ground contacts, terminal tab 98 would be disposed within the recess. The solder balls would be applied by positioning a solder ball in each of the exposed recesses as is shown in FIG. 9, where, for example, solder ball 82 is shown in recess 20 and solder 100 is shown in recess 22. Additional solder balls, 230, 232 and 234 are shown, for example, in recesses 24, 26 and 28. It will be understood that the solder ball will be positioned in all of the outer recesses of the receptacle. It will also be understood that the exterior side of plug will be substantially identical to the exterior side of the receptacle before placement of the solder balls as is shown in FIG. 8 and after emplacement of the solder balls as is shown in FIG. 9.

Figure 14:
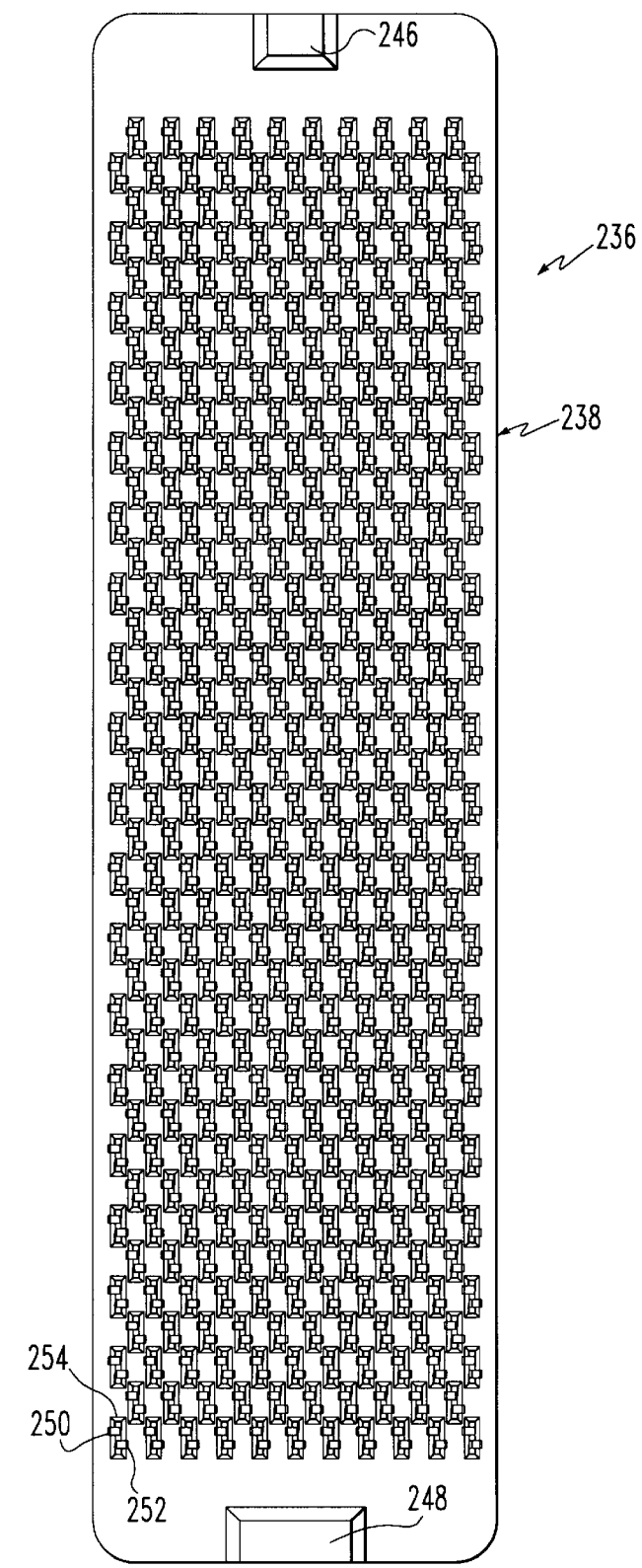
FIG. 14 is a top plan view of a receptacle element of an alternate preferred embodiment of the connector of the present invention.
Figure 15:
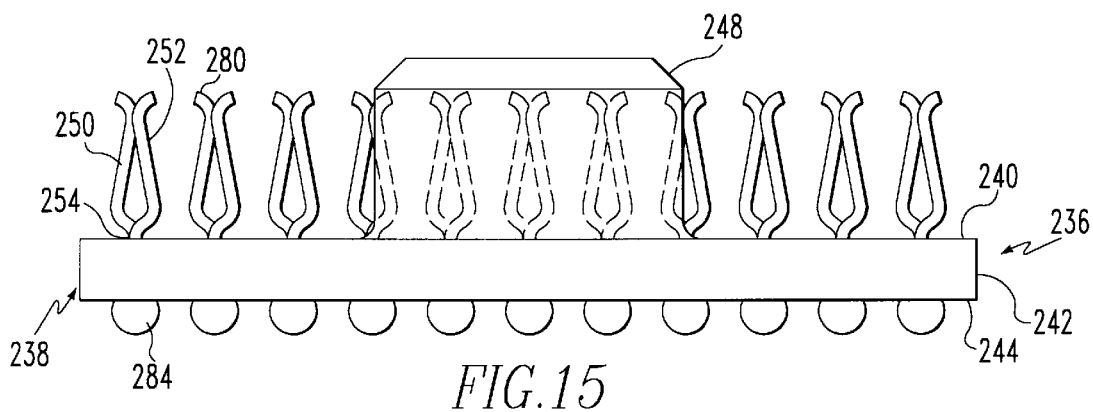
FIG. 15 is an end view of the receptacle shown in FIG. 14.
Figure 17:
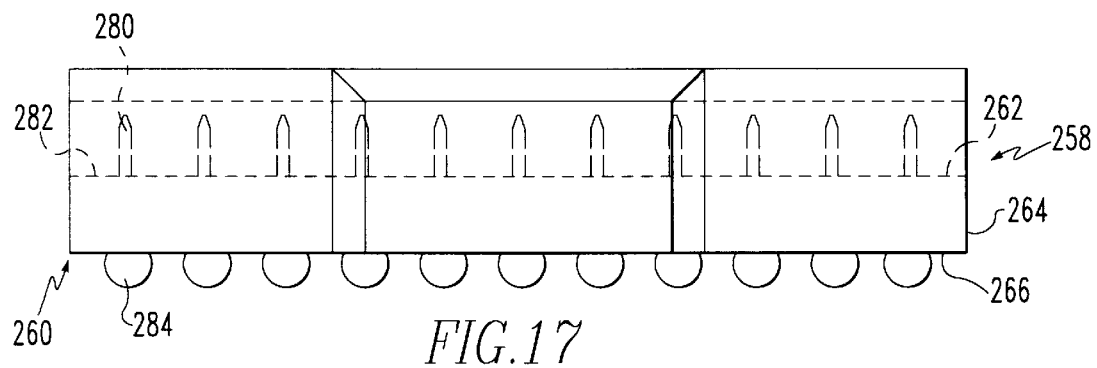
FIG. 17 is an end view of the plug shown in FIG. 16.
Figure 18:
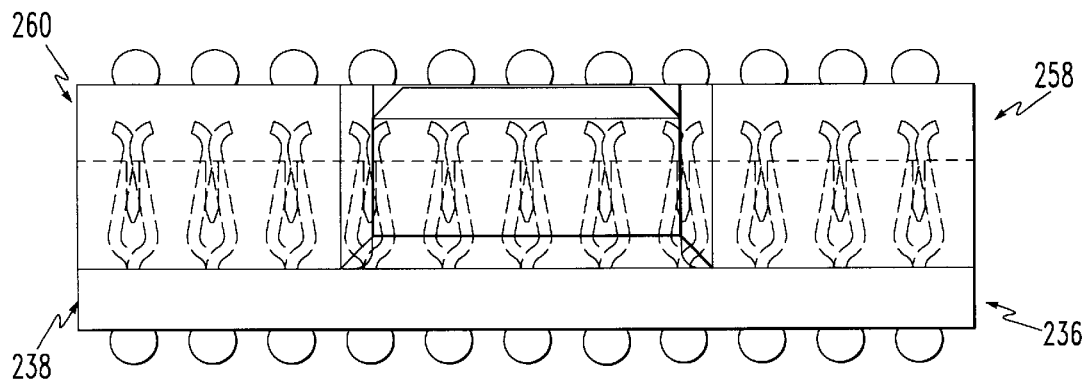
FIG. 18 is an end view of the mated receptacle and plug shown in FIGS. 14–17.
Figure 16:
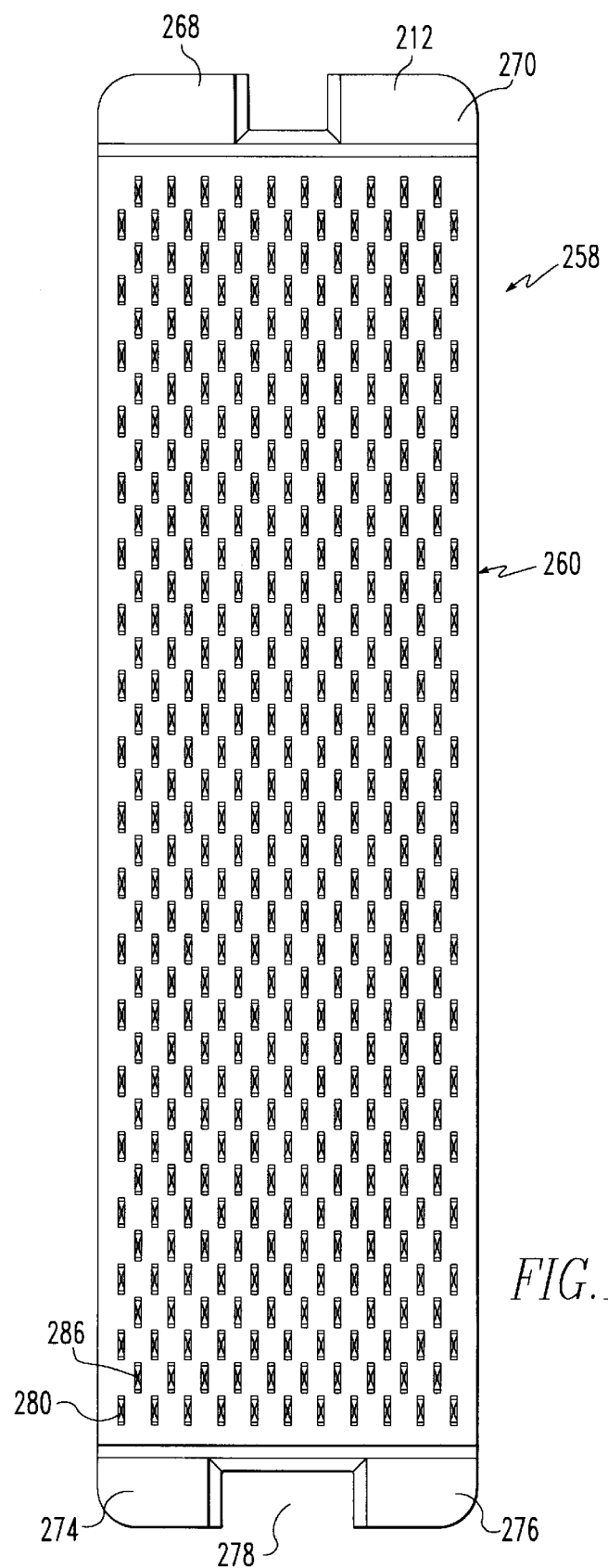
FIG. 16 is a top plan view of a plug element of the second preferred embodiment of the receptacle of the present invention.
Figure 19:
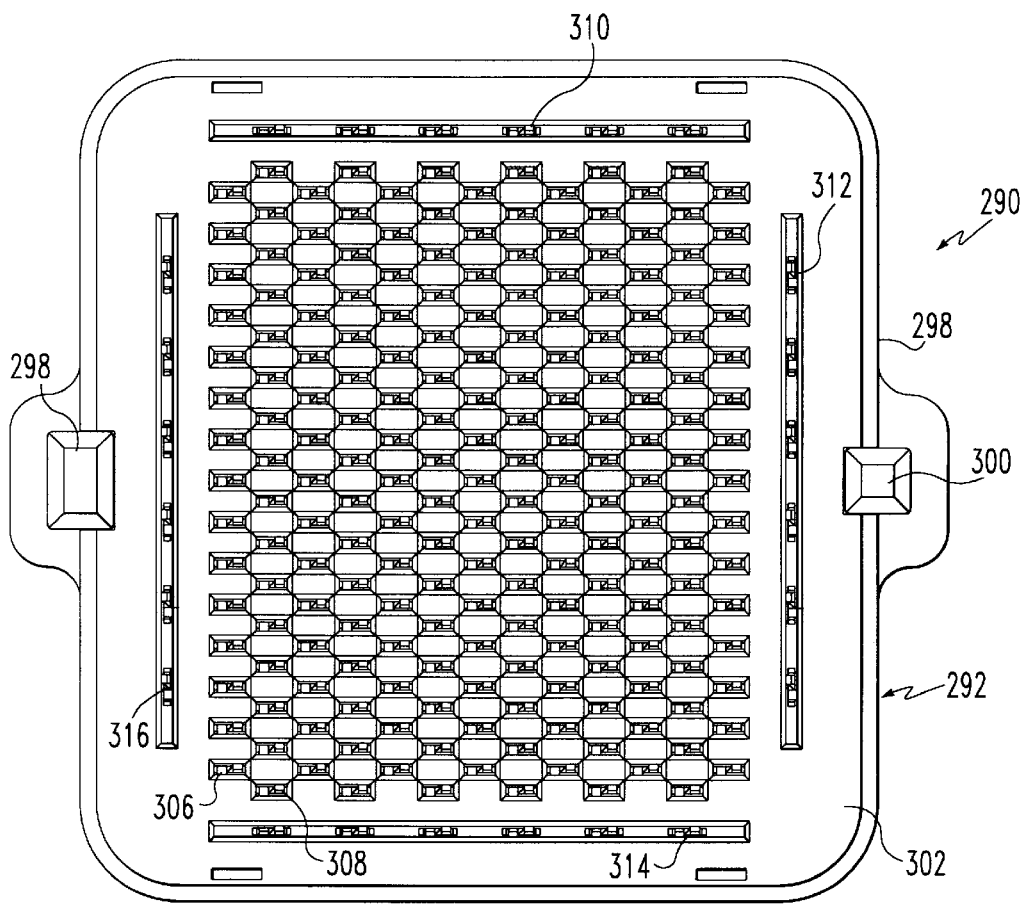
FIG. 19 is a top plan view of a receptacle used in a third preferred embodiment of the connector of the present invention.
Figure 20:
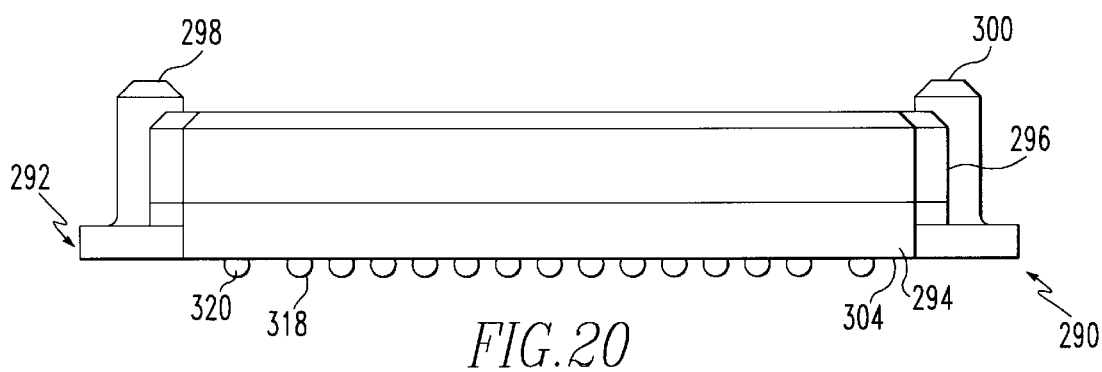
FIG. 20 is an end view of the receptacle shown in FIG. 14.
Figure 21:
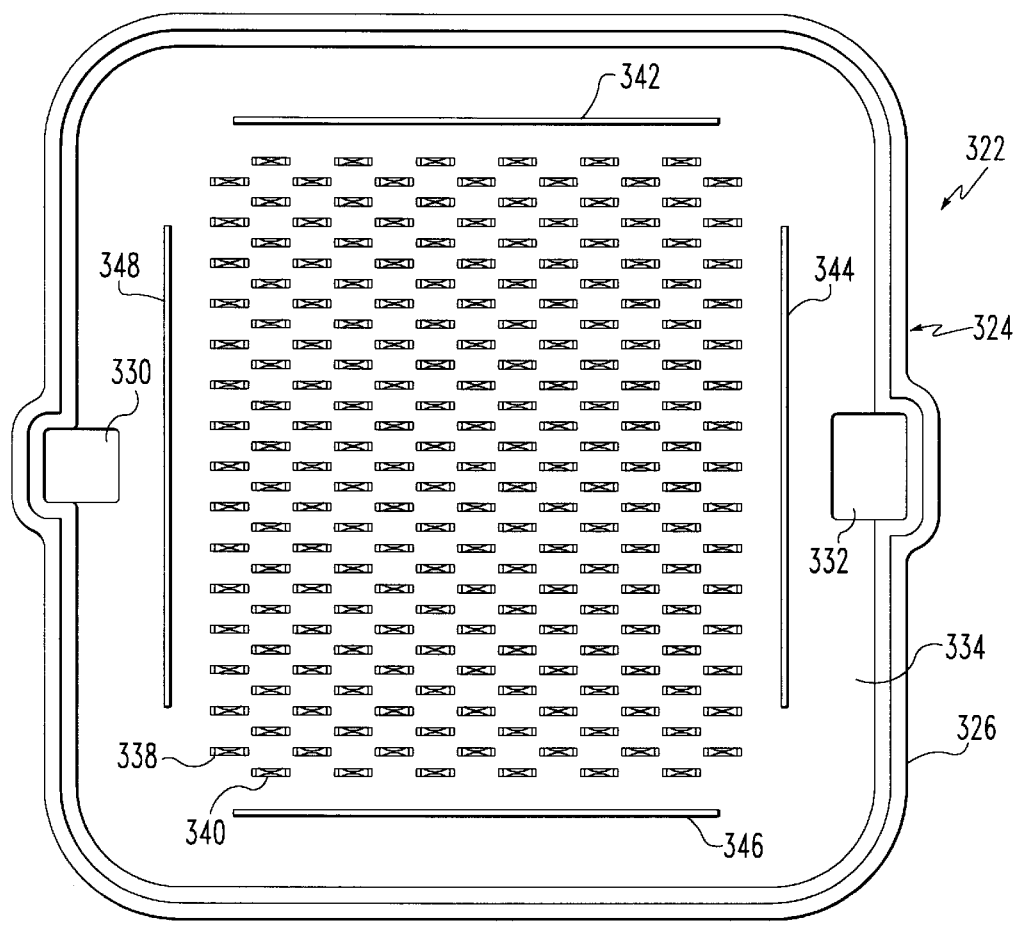
FIG. 21 is a top plan view of the plug element of the third preferred embodiment of the connector of the present invention.
Figure 22:
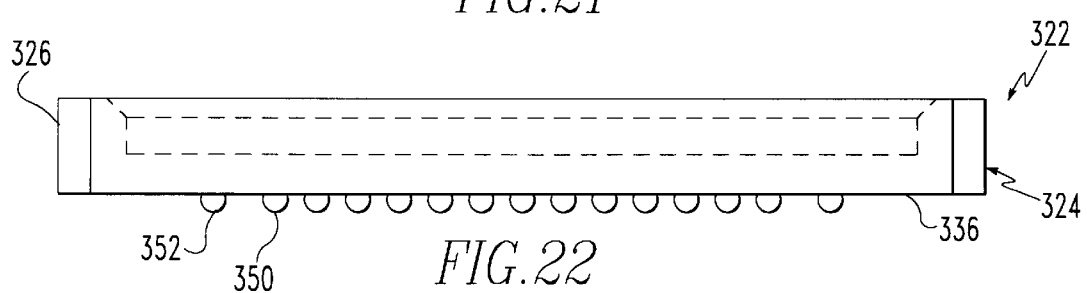
FIG. 22 is an end view of the plug element shown in FIG. 28.

Referring to FIGS. 14–18, a second preferred embodiment of the connector of this invention. Referring particularly to FIGS. 14–15, this connector includes a receptacle shown generally at numeral 236. This receptacle includes an insulative housing shown generally at 238 which has an inner side 240, a lateral side 242 and an exterior side 244. The housing also includes opposed alignment projections 246 and 248. On the inner side of the housing there are contacts 250, 251 and 252 each having sections which bow away from each other and then converge to a contact point from which then again diverge. Contacts 251 are mounted on base 231 in the same manner as the embodiment shown in FIGS. 1–13. Solder ball 254 is mounted to the board side of contacts 251 in the same manner as described above. Referring particularly to FIGS. 16 and 17 the receptacle also includes a plug shown generally at 258 which includes an insulative housing shown generally at 260 having an inner side 262, a peripheral lateral side 264 and an exterior side 266. At one end of the housing there are a pair of vertical end walls 268 and 270 with a medial end recess 272. At the opposed end of the housing there are another pair of end walls 274 and 276 with a medial end recess 278. Extending from the inner side of the housing there are a plurality of contacts as at contact 280 that extend from recesses as at 282. These contacts are each fused to a solder ball 284. It will also be seen that these contacts are positioned in a staggered arrangement. For example, contact 286 is axially offset with contact 280 so as to increase contact density. Referring particularly to FIG. 18, it will be seen that each contact in the plug such as contact 280 is vertically aligned with one of the pairs of converging contacts such as 250 and 252 in the receptacle and is interposed between these converging contacts. It will also be seen that the alignment projections 246 and 248 also engage the end recesses 272 and 278 in the plug. In this embodiment the separate ground/power contacts used in the FIGS. 1–13 embodiment are not present. Such functions can, if designed, be incorporated into the undivided contacts pairs.

Figure 23:
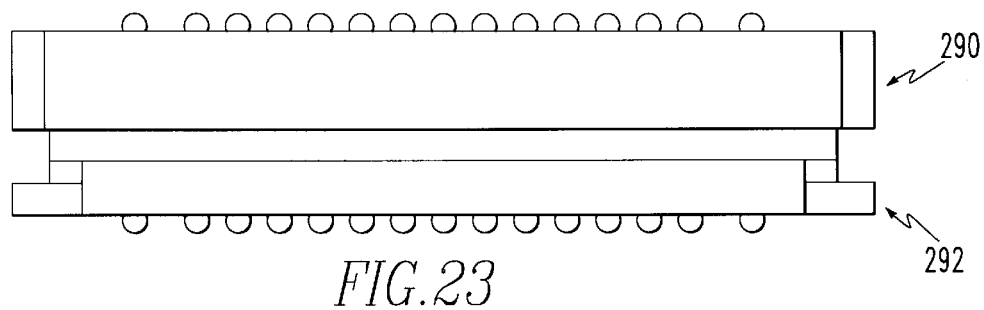
FIG. 23 is an end view of the mated receptacle and plug shown in FIGS. 19–22.

Referring to FIGS. 19–23, a third preferred embodiment is shown. This connector includes a plug shown generally at numeral 290. This plug includes a housing generally at 292 which has a base wall 294 and a peripheral lateral wall 296 as well as opposed alignment projections 298 and 300. The base wall of the housing has an inner side 302 and an outer side 304. Signal contacts, such as contact 306 extend from inner side 302. It will be seen that the signal contacts are also staggered such that contacts in alternate rows, such as signal contact 308, are offset from contact 306. The plug also includes ground or power contacts 310, 312, 314 and 316 which are arranged adjacent each of the sides of the plug parallel to one side of the lateral wall. On the exterior side of the base wall there are signal contact solder balls such as solder ball 318 and power ground contact solder balls such as 320 which are fused to their respective contacts in the same way as was described with respect to the first embodiment. This connector also includes receptacle shown generally at numeral 322 which has an insulative housing 324 that includes a base wall 326, a peripheral lateral wall 328 and alignment projection receiving recesses 330 and 332. The base wall also has an exterior side 334 and an inner side 336. Projecting from the inner side there are signal contacts as at contact 338 and contact 340. It will be seen that these contacts in adjacent transverse rows are also axially offset to allow an increase in contact density. Parallel to each side of the peripheral wall there are lateral power or ground contacts 342, 344, 346 and 350. On the exterior side of the base wall there are for each signal pin a solder ball such as solder ball 352 and there are solder balls as at solder ball 354 for attaching each of the power or ground pins. Referring to particularly to FIG. 23, it will be seen that at the plug 290 engages receptacle 322.

Figure 24:
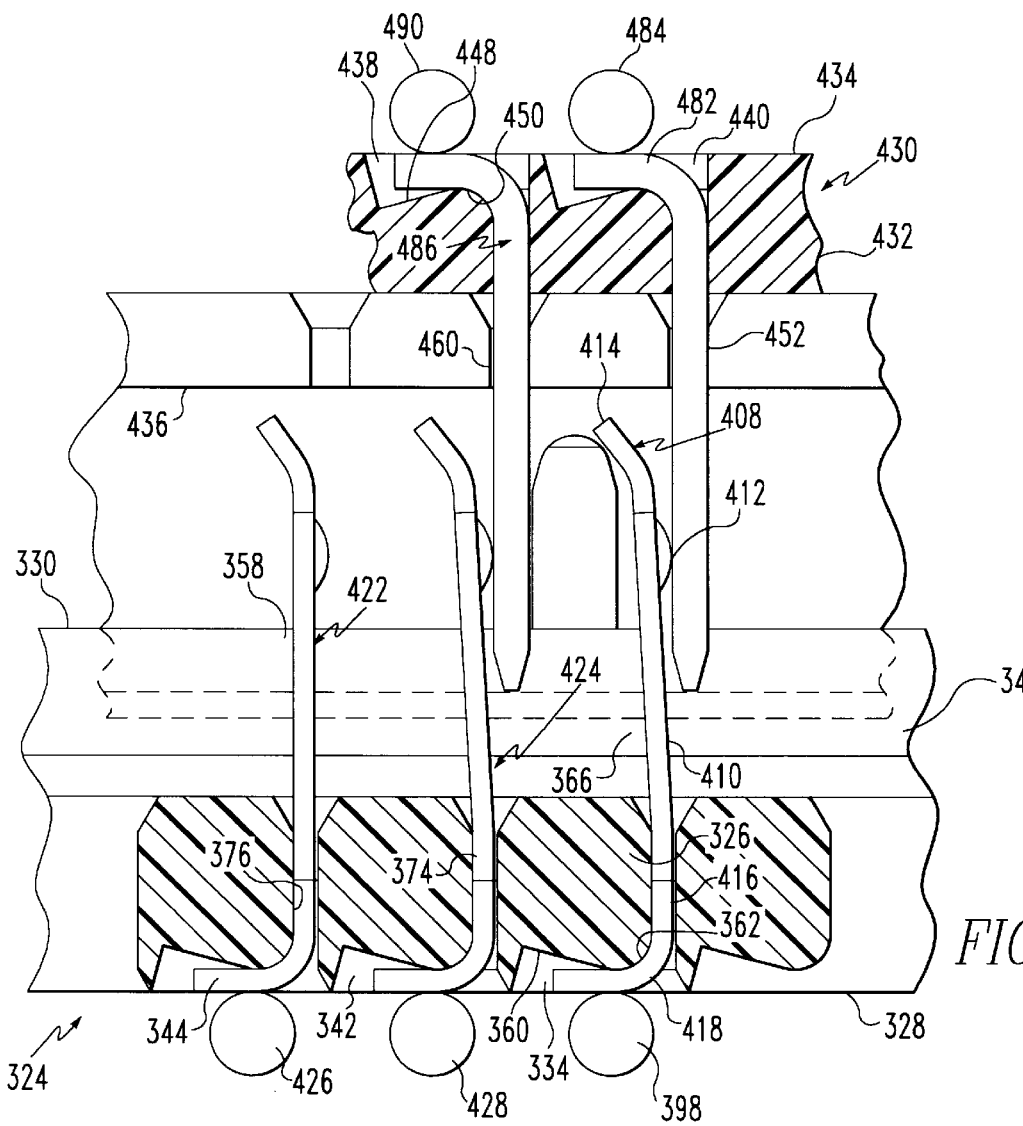
FIG. 24 is a side cross sectional view in fragment of another preferred embodiment of the connector of another preferred embodiment of the connector to the present invention in which the plug and receptacle are metal.
Figure 25:
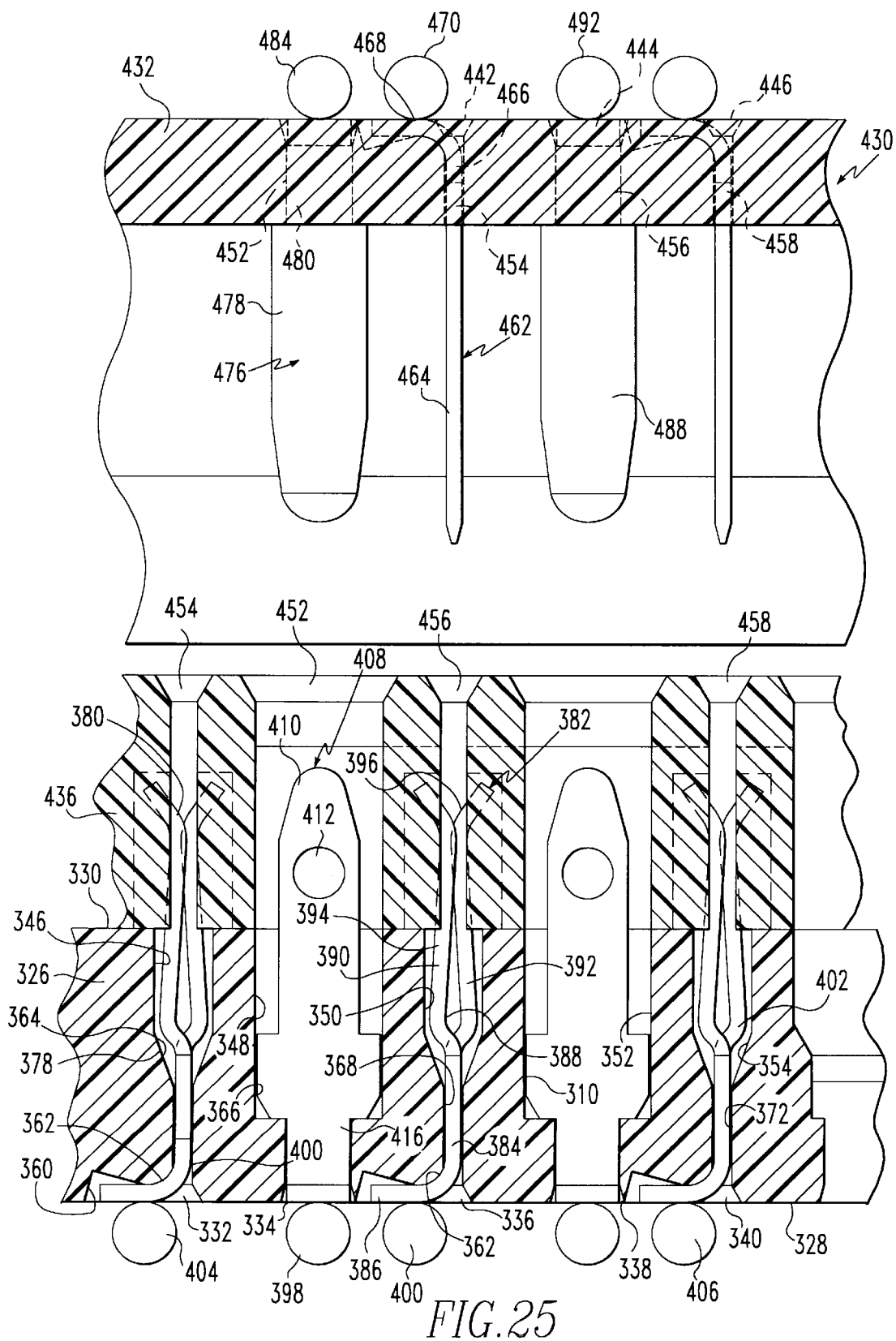
FIG. 25 is a front cross sectional view in fragment of the connector shown in FIG. 24 in which the plug and receptacle are unmated.

Referring to FIGS. 24–25, another embodiment of the invention is shown. The receptacle of this connector is shown generally at numeral 324. This receptacle has a base wall 326 which has an exterior side 328 and an interior side 330. On the exterior side there are recesses as at recess 332, 334, 336, 338, 340, 342 and 344. On the interior side there are recesses as at recess 346, 348, 350, 352, 354, 356 and 358. Each of these recesses has a base wall as at wall 360 and a lateral wall as at wall 362. Between the exterior and interior recesses there are medial slots as at slot 364, 366, 368, 370, 372, 374 and 376. Each of these slot has a wide lower section as at section 378 and a narrower upper section as at section 380. In, for example, slot 364 there is a ground/power contact shown generally at numeral 382. This contact has a lower section 384 from which there is a perpendicular tab 368. This contact also has an upper section shown generally at numeral 388 which is made up of forks 390 and 392. Each of these forks has a converging section and an outwardly diverging section 396. The perpendicular tab 386 is attached to a solder ball 398. Other ground/power contacts as at contacts 400 and 402 are also attached respectively in the same way to solder balls 404 and 406. The receptacle also includes a signal contact shown generally at numeral 408 which has an upper section 410 with a forward projection 412 and rearward bend 414. The signal contact also has a medial section 416 where it engages the insulative housing and a lower perpendicular tab 418 where it engages a solder ball 420. Other signal contacts as at contacts 422 and 424 engage respectively solder balls 426 and 428. The connector also includes a plug shown generally at numeral 430 which includes a base wall 432 having an exterior side 434 and an interior side 436. On the exterior side there are recesses as at recess 438, 440, 442, 444 and 446. Each of these recesses has a base wall as at wall 448 and a lateral wall as at 450. Connecting with each of these recesses is a contact receiving slot as at slot 452, 454, 456, 458 and 460. The plug also has a number of power/ground contacts as, for example, is shown generally at numeral 462. Each of these contacts has a contact section 464 where it engages the forks of the ground/power contact on the receptacle. These contacts also have a medial section 466 where it engages the housing and a perpendicular tab 468 where they engage a solder ball 470. Other ground/power contacts as, for example, 472 engage solder balls as at 474. The plug also includes a number of signal contacts as, for example, is shown generally at numeral 476. Each of these signal contacts includes a contact section 478 which engages the signal contacts in the receptacle, a medial section 480 where it engages the housing and a perpendicular tab 482 which engages a solder ball. Other signal contacts as at 486 and 488 engage respectively other solder balls as at 490 and 492.

In the method of this invention the conductive element will preferably be a solder ball. Those skilled in the art, however, will appreciate that it may be possible to substitute other materials which have a melting temperature less than the melting temperature of the contents and that the conductive element will be heated to a temperature greater than its melting temperature. The solder ball or other conductive element will also preferably have a diameter which is from about 50 percent to 200 per cent of the width of the recess. This diameter will also preferably be related to the depth of the recess and be from 50 percent to 200 per cent of that depth. The volume of the solder ball will preferably be from about 75 percent to about 150 percent of the volume of the recess and, more preferably, will be about the same volume as the recess. The contact tab will extend into the recess by a sufficient amount to present adequate surface area to fuse to the solder ball, and will usually preferably extend into the recess from about 25 percent to 75 percent and more preferably to about 50 percent of the depth of the recess. The recess ordinarily will be circular, square or any other regular polygon in cross section. When a solder ball is used, any conventional tin lead alloy used in soldering compositions would be acceptable, but the use of a eutectic solder is preferred. Before the solder ball or other conductive element is positioned in a recess, that recess would usually be filled with solder flux. Any conventional organic or inorganic solder flux is believed to be suitable for this purpose, but a no clean solder cream or paste is preferred. Heating is preferably conducted in a panel infra red (IR) solder reflow conveyor oven. The solder element would ordinarily be heated to a temperature of from about 185° to 195° C. but, depending on the material of the housing, solders having melting temperatures up to about 800° F. may be used. The conveyor oven would preferably be operated at a rate of speed from about 10 to 14 inches per second and would be moved through a plurality of successive heating phases for a total time of about 5 minutes to about 10 minutes.

The method of the present invention is further described with reference to the following examples.

EXAMPLE 1

Figure 24A:
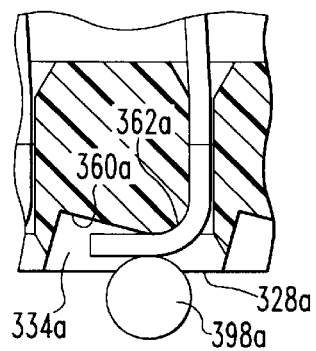

An insulative housing for a connector plug and receptacle substantially is described above in connection with FIGS. 1–18 was made. Contacts also substantially in accordance with that description were also positioned in the housing. These contacts were beryllium copper and were plated with gold over their entire surface area to a thickness of 30 microns. The housing material was DUPONT H6130 liquid crystal polymer (LCP). The length and width of the plug were respectively 52.5 inches (including mounting brackets) and 42.36 inches. The recesses on the exterior surfaces of the plug and receptacle housing were cross sectionally square having a side dimension of 0.62 mm and a depth of 0.4 mm. About 2 mm of the contact extended into the recess. Other dimensions were generally in proportion to the above dimensions in accordance with FIGS. 1–18. On the exterior sides of both the plug and receptacle the recesses were filled or substantially filled with CLEANLINE LR 725 no clean solder cream which is commercially available from Alphametals, Inc. of Jersey City, N.J. Both the plug and receptacle were turned over on their exterior sides on a quantity of spherical solder balls so that a solder ball became embedded in each of the recesses. The solder balls used were ALPHAMETAL no flux 63SN/37PB spherical solder balls which had a diameter of 0.030 inch ±0.001 inch and a weight of 0.00195 g. The plug and receptacle were then treated with FLUORAD which reduces wicking and is available from 3M Corporation. After such treatment the plug and receptacle were then placed in a BLUE MAX convection oven and heated at 105° C. for two hours. The plug and receptacle were then positioned on separate boards made up of conventional reinforced epoxy printed circuit board material. These boards have lengths of 6 inches, widths of 1.5 inches and thicknesses of 0.061 inches. Referring to FIG. 8, a thermocouple was placed on the exterior surface of the plug in position T. Another thermocouple was centrally positioned upon the supporting board surface adjacent the plug. Both the plug and the receptacle were then treated in a KIC panel-infrared (IR) conveyer solder reflow oven. As is conventional for this type of oven, the plug and receptacle were moved through six zones in the reflow oven. The conveyor speed was 13 in/min. Heating temperatures in each zone are shown in Table 1. Minimum and maximum temperature for the plug and for the supporting board are shown in Table 2. Temperature by time and distance for the plug is shown in the curve in FIG. 24*a* wherein the heavy line is temperature at the thermocouple on the supporting board and the light line is temperature at the thermocouple on the plug exterior surface. A visual inspection of the plug and the receptacle after solder reflow was that nearly all the solder balls had fused to the contact leads in their respective cavities. Solder ball height above the exterior surfaces of the plug and the receptacle also appeared to be relatively uniform. There was no noticeable warping or bending of the housing.

TABLE 1

| | Temperature (° C.) | | | | | |
|---|---|---|---|---|---|---|
| ZONE | #1 | #2 | #3 | #4 | #5 | #6 |
| UPPER | 350 | Unheated | 275 | 230 | 310 | Unheated |
| LOWER | Unheated | Unheated | 275 | 230 | 310 | Unheated |

TABLE 2

| | Connector | | Board | |
|---|---|---|---|---|
| Example | Max Temp (° C.) | Time (Min. & Sec.) | Max Temp (° C.) | Time (Min. & Sec.) |
| 1 | 187 | 4:09.2 | — | — |
| 1 | — | — | 234 | 4:33.6 |
| 2 | 191 | 4:53.2 | — | — |
| 2 | — | — | 209 | 5:10.4 |

EXAMPLE 2

Another plug and receptacle were prepared in essentially the same way as was described in Example 1 and solder balls were emplaced in the recesses on the exterior sides. Several hours after the treatment in the KIC Panel/IR conveyor solder reflow oven in Example 1 when atmospheric conditions were somewhat different another plug and receptacle essentially similar to the ones used in Example 1 were subjected to similar reflow heating as were used in Example 1. Oven conditions are shown in Table 1. Minimum and maximum temperatures of the plug and the adjacent supporting board are shown in Table 2. Temperature by time and distance is shown in FIG. 26*b*. It will be seen that the curve shown in FIG. 26*b* is somewhat different than that shown in FIG. 26*a* which difference is attributed to different ambient atmospheric conditions. A visual inspection of the resulting connector showed similar results to those achieved in Example 1.

EXAMPLE 3

Figure 26A:
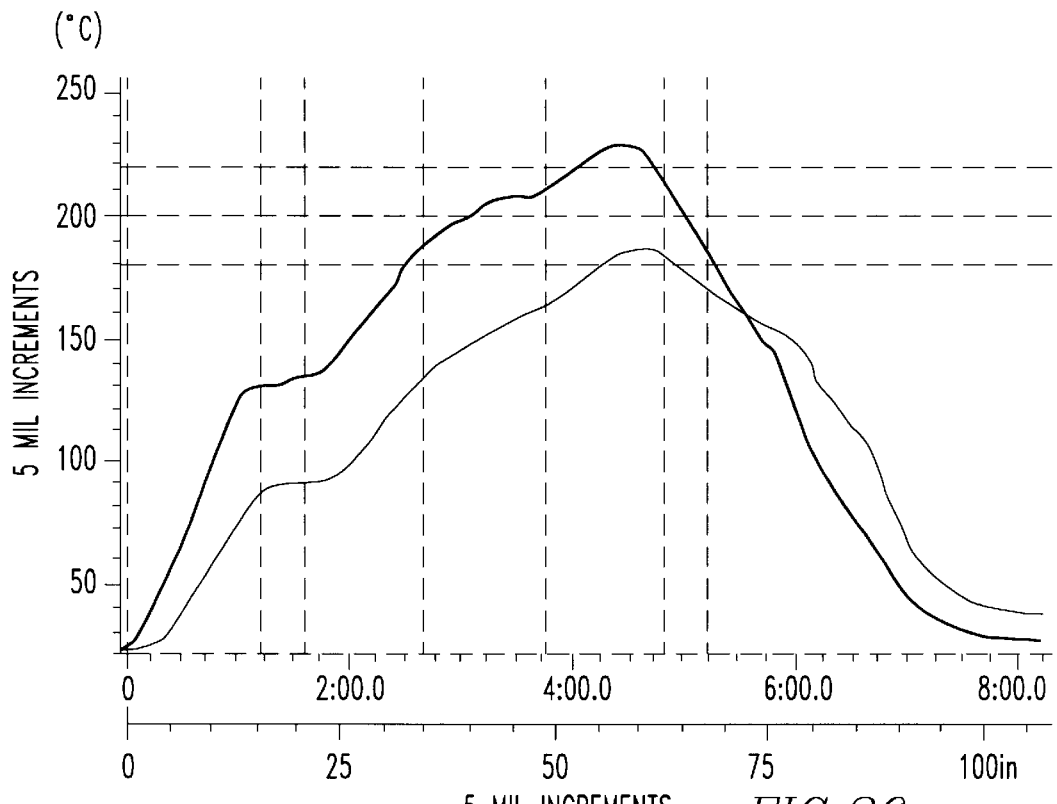
FIGS. 26a and 26b is a graph showing temperature versus time and distance during solder reflow in Examples 1 and 2 of the method of the present invention.
Figure 26B:
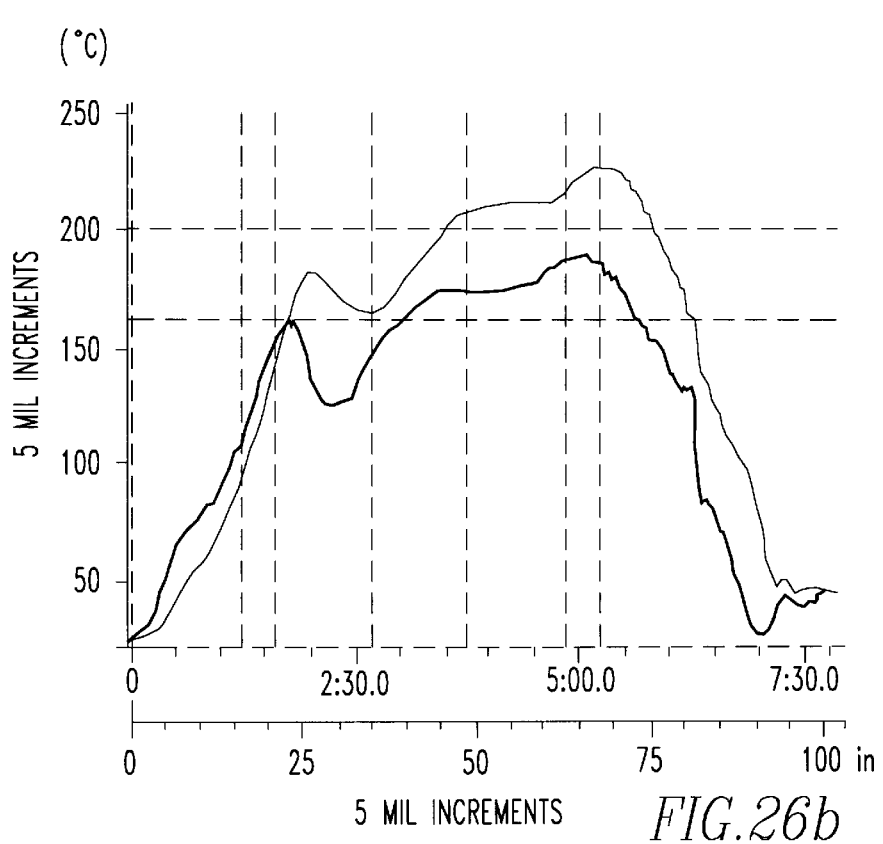
Figure 27A:
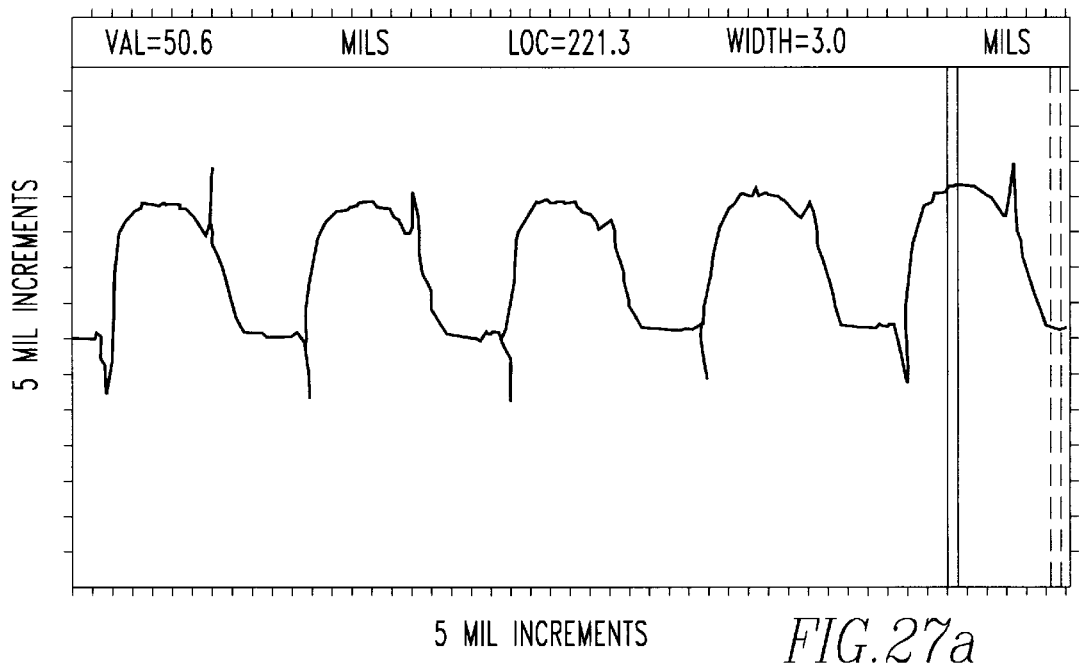
FIGS. 27a–27f are generated profiles of the product of Example 3 of the method of the present invention.
Figure 27B:
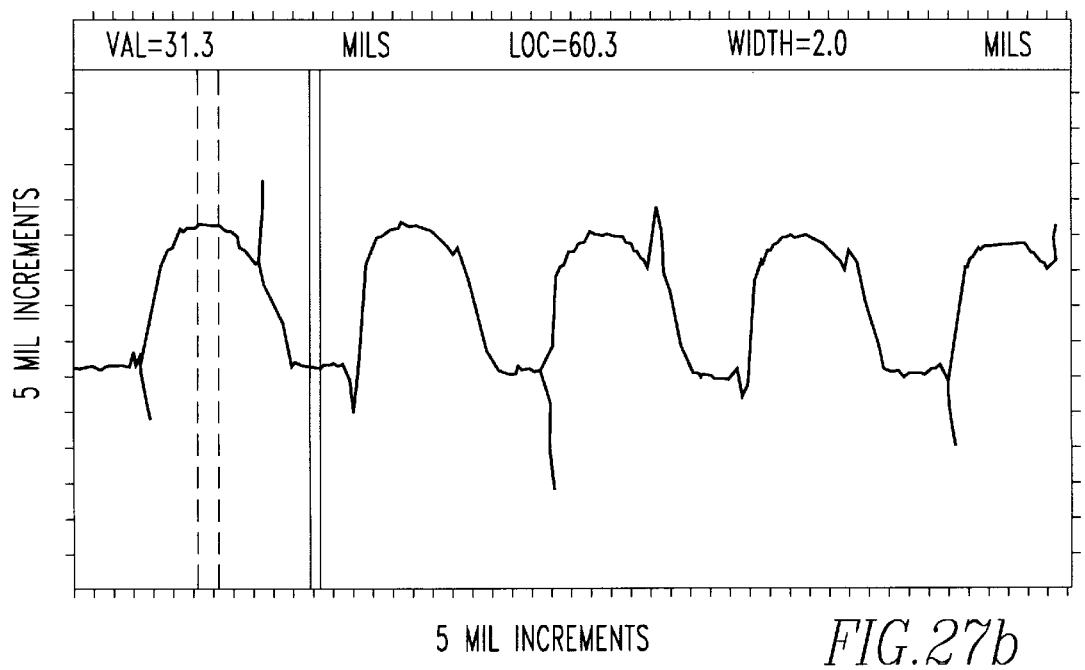
Figure 27C:
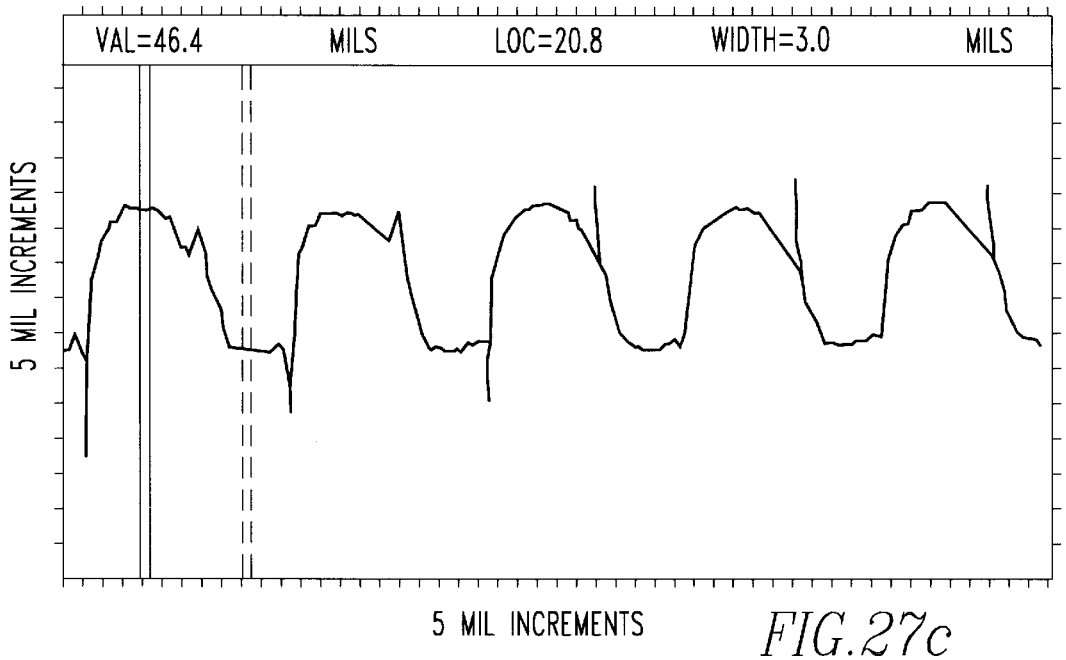
Figure 27D:
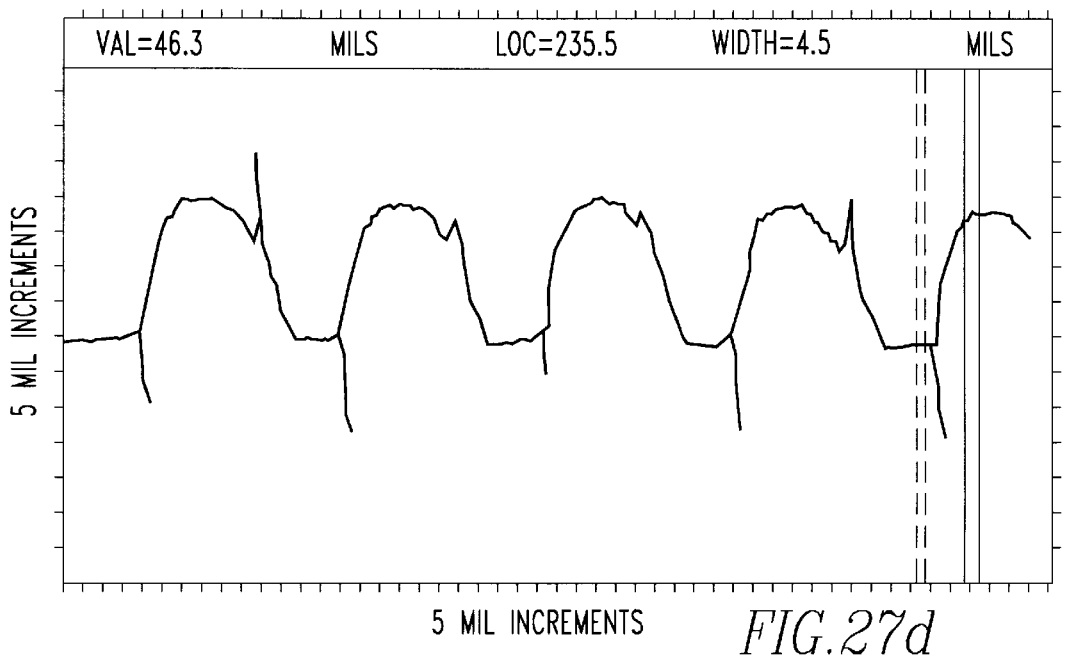
Figure 27E:
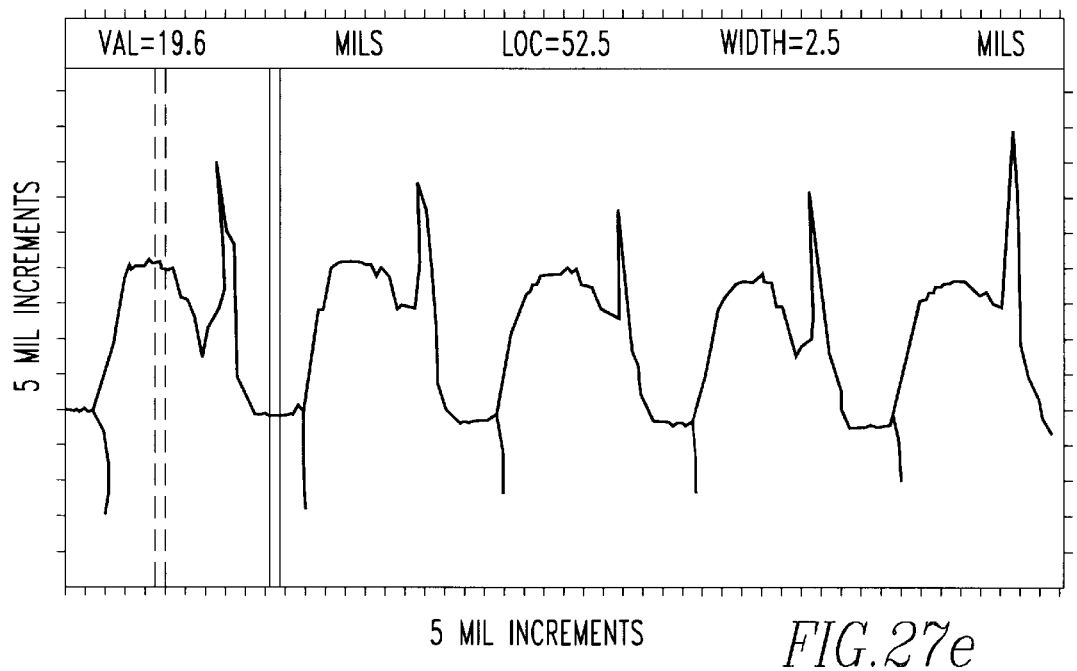
Figure 27F:
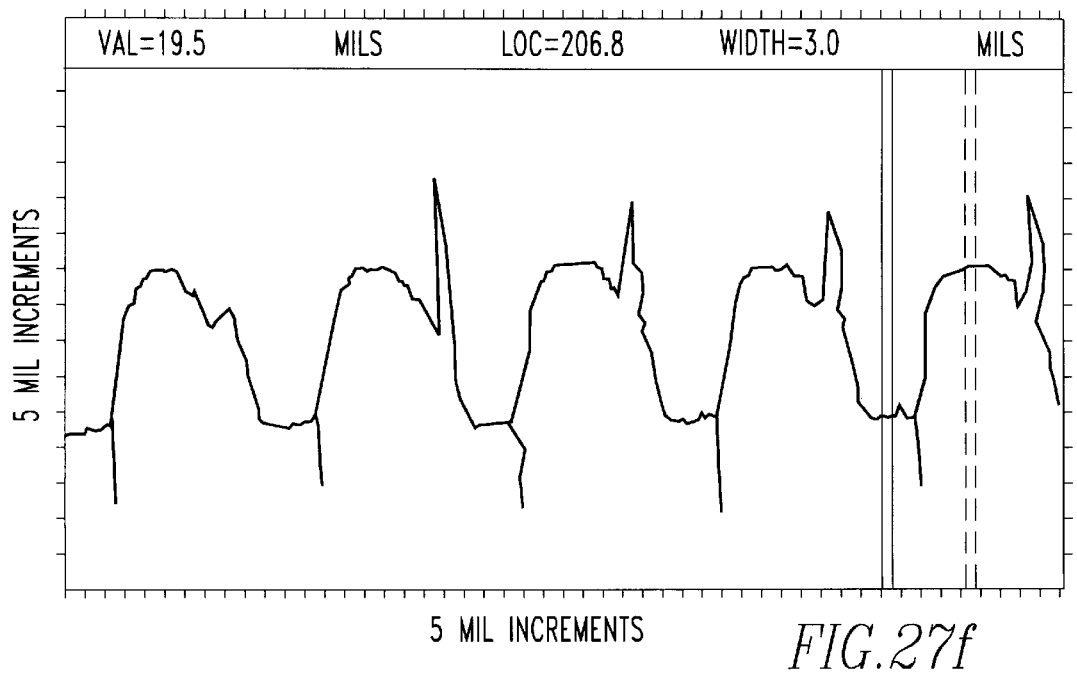

Another connector was made using essentially the same conditions as were described in Examples 1 and 2 except that the specific curves shown in FIGS. 26a and 26b may have been somewhat different because of atmospheric conditions. After the completion of this connector, the solder balls at six locations on the exterior surface of the plug were examined by Laser Point Range Sensor (PRS) available from Cyber Optics Corporation of Minneapolis, Minn. Referring to FIG. 9, these locations are identified as areas 27a and 27b when the laser was directed from $L_1$, as areas 27c and 27d when the laser was directed from $L_2$ and as areas 27e and 27f when the laser was directed from $L_3$. At all these areas a laser profile was taken of the profiles of the five solder balls in each of these areas. Reproductions of these laser profile are shown in FIGS. 27a–27f. The height of each of these solder balls at its highest point above the plane of the exterior side of the plug is shown in Table 3. For each of these groups the solder ball closest to the front of the plug as shown in FIG. 9 was considered the first position in Table 3 and was the solder ball on the left of the graphs in FIGS. 27a–27f. An examination of these results reveals that in each group of five solder balls there was what was considered to be an acceptable degree of uniformity for the height of the solder balls.

TABLE 3

| | POSITION HEIGHT (.001 in.) | | | | |
|---|---|---|---|---|---|
| GROUP | 1 | 2 | 3 | 4 | 5 |
| 26a | 18.1 | 18.9 | 19.5 | 19.6 | 19.1 |
| 26b | 19.2 | 18.5 | 17.6 | 18.5 | 18.0 |
| 26c | 20.4 | 21.1 | 21.6 | 21.1 | 21.4 |
| 26d | 19.9 | 20.1 | 20.1 | 21.2 | 20.5 |
| 26e | 18.2 | 18.9 | 19.3 | 18.2 | 18.7 |
| 26f | 19.1 | 18.2 | 19.0 | 18.2 | 18.9 |

EXAMPLE 4

Figure 28A:
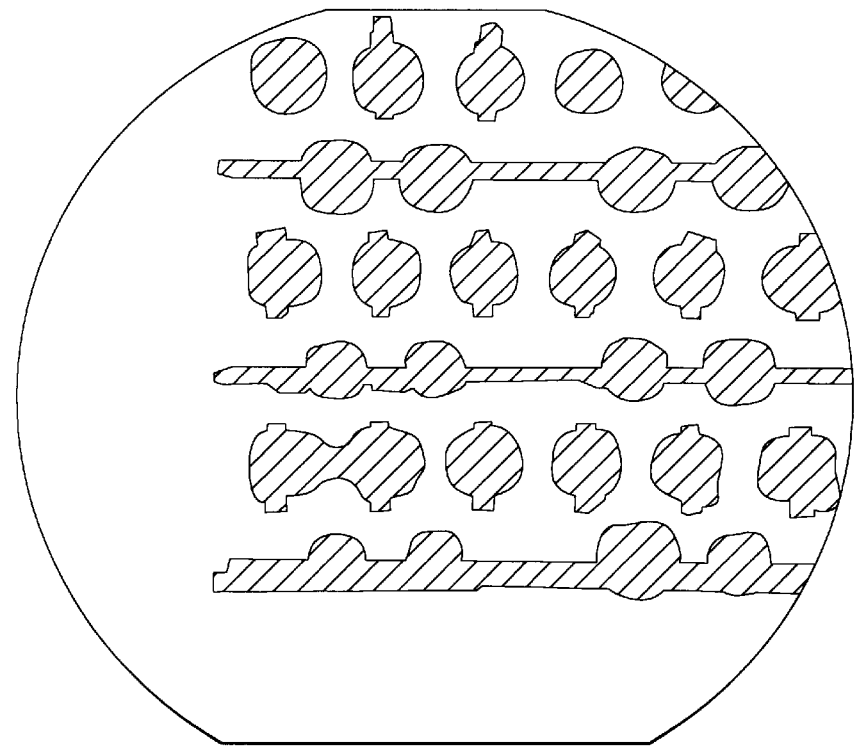
FIGS. 28a and 28b are x-ray diffraction photographs showing the product of Example 4 of the method of the present invention.
Figure 28B:
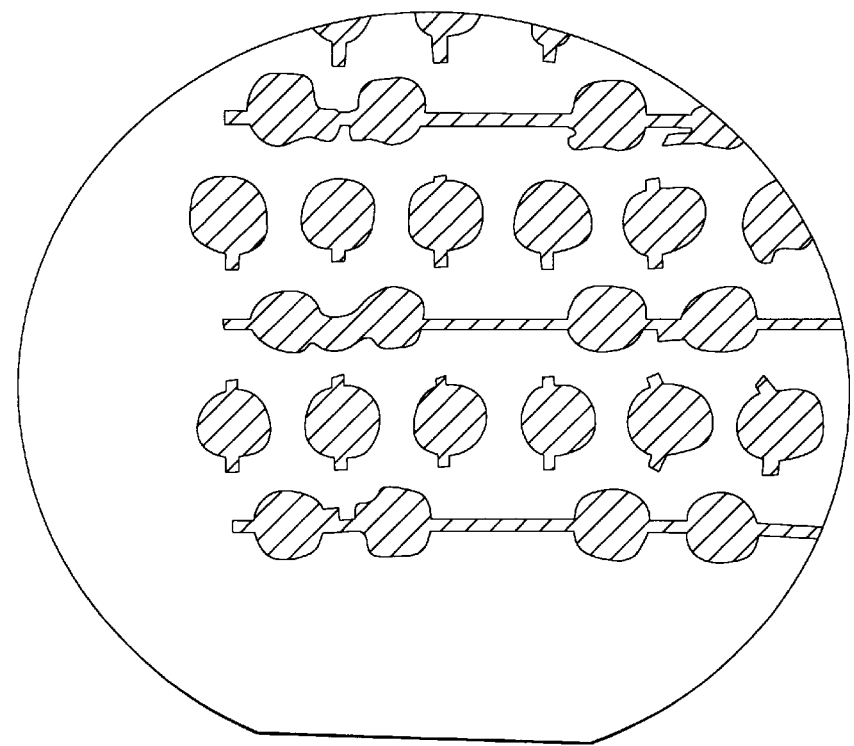
Figure 28C:
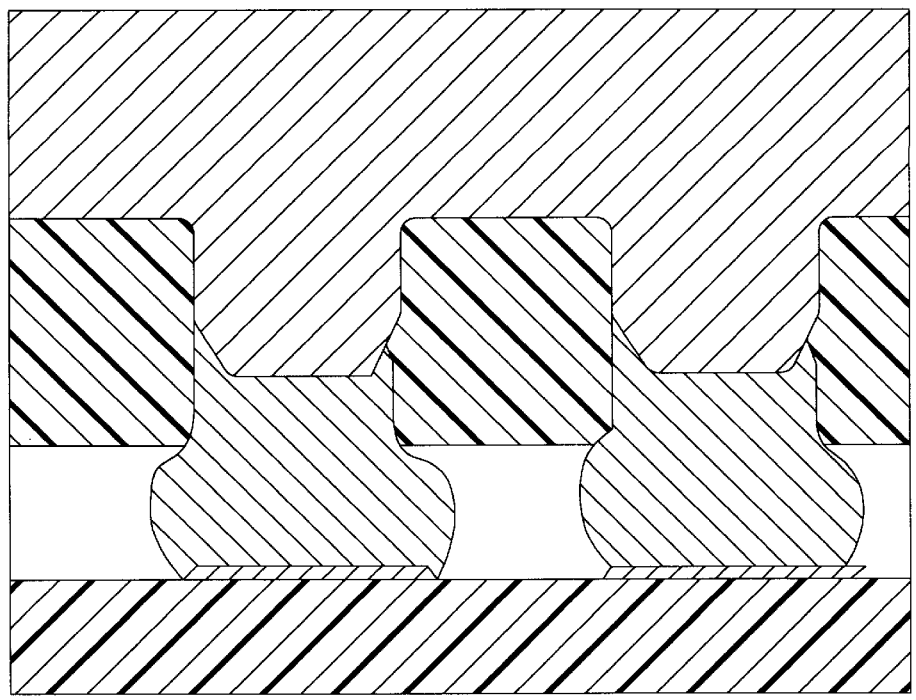
FIGS. 28c and 28d electron microscope photographs showing the product of Example 4 of the method of the present invention.
Figure 28D:
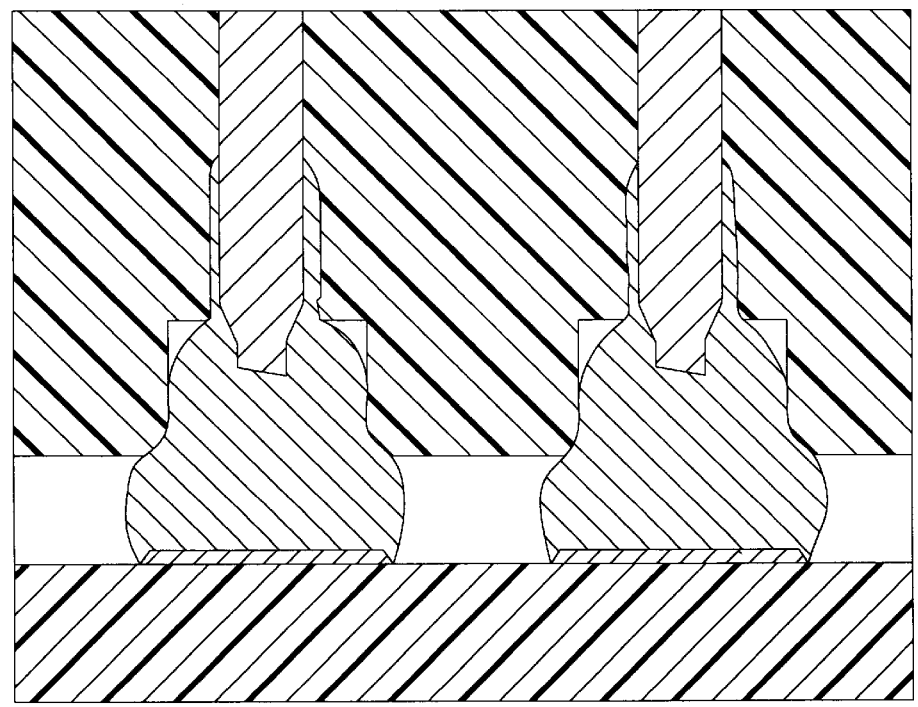

Another connector was made essentially according to the conditions described in Examples 1 and 2 except because of atmospheric conditions the specific curves shown on FIGS. 26a and 26b may have been somewhat different. In almost all cases solder balls were satisfactorily fused to the contact leads and solder balls were of an acceptably uniform height above the plane of the exterior surfaces of the plug and receptacle on visual inspection. A stencil with a pattern matching the solder balls on both the plug and receptacle with conductive solder pads on two different circuit boards each having a length of 4⅛ inches, a width of 2½ inches and a thickness of 0.061 inches. The plug was positioned on one stencil and one piece of circuit board material and the receptacle was positioned on the other stencil and piece of circuit board material. The plug and receptacle were then separately again treated in the KIC Panel/IR conveyor oven under conditions similar to those described in fusing the solder balls to the leads except that conveyor speed was decreased to 11 in/sec. After cooling, the plug and receptacle were found to have been satisfactorily fused to their respective boards. Referring to FIG. 9, the solder balls were examined by x-ray diffraction. A photograph showing these x-rays at these positions are attached respectively at FIGS. 28a and 28b. Cross sectional electron microscope photographs were taken to show the fusing of the solder balls to the signal contact leads and the fusing of the solder balls to the printed circuit board material. These electron microscope photographs are shown respectively at FIGS. 28c and 28d. There was only one short between only adjacent signal contacts and good connections were made between the contacts and the solder balls and between the solder balls and the boards.

It will be appreciated that electrical connector and the method of its manufacture has been described in which the connector has contact leads which, surprisingly and unexpectedly, are able to be fused to solder balls and in which those solder balls in turn may be fused to a PWB.

Surprisingly and unexpectently it was also found that therre was a relatively high degree of uniformity in the profiles of the solder balls and, in particular, in the weights of the solder balls above their substrates.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A product of a method for placing an exterior conductive contact on an electrical connector having an exterior side and an interior side comprising the steps of:

(a) providing at least one recess on the exterior side of the connector;

(b) providing a conductive contact extending from adjacent the interior side of the connector to an end located in the recess on the exterior side of the connector;

(c) positioning a conductive element in the recess provided on the exterior side of the connector; and (d) heating the conductive element emplaced in the recess to a temperature sufficient to soften said conductive element and fuse said conductive element to the contact extending into said recess.

2. The product of claim 1 wherein the conductive element has a melting temperature and in step (d) the metallic element is heated to a temperature greater than said melting temperature.

3. The product of claim 2 wherein the contact has a melting temperature which is greater than said melting temperature of the conductive element, and the conductive element is heated to a temperature less than said melting temperature of the contact.

4. The product of claim 1 wherein the conductive element is spherical.

5. The product of claim 4 wherein the recess has a width and the conductive element has a diameter of about 50 percent to about 200 percent of said width.

6. The product of claim 5, wherein the recess has a depth of about 25 percent to about 75 percent of the width of the recess.

7. The product of claim 4 wherein the recess is cross sectionally a regular polygon.

8. The product of claim 4 wherein the recess is cross sectionally a square.

9. The product of claim 4 wherein the recess is cross sectionally circular.

10. The product of claim 5 wherein the contact extends into the recess by an amount which is from about 25 percent to about 75 percent of the depth of the recess.

11. The product of claim 1 wherein the conductive element is comprised of a solder composition.

12. The product of claim 11 wherein the solder composition is a eutectic solder composition.

13. The product of claim 11 wherein prior to step c a soldering flux is placed in the recess.

14. The product of claim 13 wherein the recess has a base surface which is covered with a layer of said soldering flux.

15. The product of claim 14 wherein the recess is filled with soldering flux.

16. The product of claim 11 wherein the metallic element is heated from a temperature of up to 800° F.

17. The product of claim 16 wherein the conductive element is heated by infrared convection.

18. The product of claim 17 wherein during heating the connector element is positioned on a moving conveyer.

19. The product of claim 18 wherein the conductive element is heated for about from 5 minutes to about 10 minutes.

20. The product of claim 19 wherein the connector is moved through plurality of successive heating phases.

21. The product as recited in claim 1, further comprising the step of:
   (e) heating said conductive element sufficient to soften said conductive element and fuse said conductive element to a substrate, wherein said conductive element provides a primary electrical current path between said connector and said substrate.

22. The product as recited in claim 21, wherein said substrate is a printed wiring board (PWB).

23. The product as recited in claim 1, wherein the contact providing step comprises the step of providing a plurality of contacts arranged in an array.

24. The product as recited in claim 23, wherein all of said contacts are aligned in a plurality of axial rows.

25. The product as recited in claim 24, wherein all of said contacts are arranged in one of a plurality of transverse rows.

26. The product as recited in claim 25, wherein between each of said axial rows there is at least one elongated ground/power contact.

27. The product as recited in claim 26, wherein each of the signal contacts and each of the ground/power contacts is fused to at least one solder ball.

28. The product as recited in claim 27, wherein each of the solder balls is fused to a PWB.

29. The product as recited in claim 28, wherein the product is a plug.

30. The product as recited in claim 29, further comprising a peripheral wall extending upwardly from a base wall, said recess located in said base wall.

31. The product as recited in claim 28, wherein the product is a receptacle.

32. The product as recited in claim 31, wherein said receptacle is mated with a plug having a similar array of signal and ground contacts.

33. The product as recited in claim 31, wherein the receptacle has a cover having a plurality of contact receiving slots and said cover is superimposed over a base wall.

34. The product as recited in claim 33, wherein the cover has a lateral peripheral wall.

35. The product as recited in claim 34, further comprising a latch to fix the cover to the base wall.

36. The product as recited in claim 23, wherein the plurality of contacts are positioned in a staggered arrangement.

37. The product as recited in claim 36, wherein the product has a plurality of sides and a power/ground contact is positioned in parallel relation to each of said sides.

38. The product as recited in claim 36, wherein each of the signal contacts is fused to a solder ball.

39. The product as recited in claim 37, wherein each of the ground/power contacts is fused to at least one solder ball.

40. The product as recited in claim 1, wherein a contact support extension of said electrical connector bears against the contact.

41. The product as recited in claim 33, wherein a contact support extension of the electrical connector extends into at least one of said slots to bear against one of the contacts.

42. The product as recited in claim 1, wherein said conductive element is formed of a fusible material.

43. The product of claim 1 wherein the contact element is plated with a solderable metal where it is fused to the conductive element and is plated with a non-solderable metal adjacent to where it is fused to the conductive element.

44. The product as recited in claim 1, wherein said end of said conductive contact is positioned substantially coplanar with said exterior side of said connector.

45. The product as recited in claim 1, wherein said end of said conductive contact is offset from said exterior side of said connector.

46. The product as recited in claim 42, wherein the fusible material is a solder ball.

47. The product as recited in claim 1, wherein the conductive element positioning step includes the step of placing a flowable bonding material between said contact and said conductive element.

48. The product as recited in claim 47, wherein the flowable bonding material comprises solder paste and the heating step includes reflowing the solder paste to join the conductive element onto the contact.

* * * * *